(12) United States Patent
Mita et al.

(10) Patent No.: US 6,426,548 B1
(45) Date of Patent: Jul. 30, 2002

(54) SEMICONDUCTOR DEVICE, LEAD-PATTERNING SUBSTRATE, AND ELECTRONICS DEVICE, AND METHOD FOR FABRICATING SAME

(75) Inventors: Mamoru Mita; Gen Murakami, both of Ibaraki (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 09/150,693

(22) Filed: Sep. 10, 1998

(30) Foreign Application Priority Data

Mar. 18, 1998 (JP) .......................... 10-067947
Apr. 10, 1998 (JP) .......................... 10-099315

(51) Int. Cl.$^7$ ...................... H01L 23/495; H01L 23/48; H01L 23/52
(52) U.S. Cl. ................. 257/673; 257/772; 257/666; 257/693; 257/779; 257/737
(58) Field of Search ................. 257/772, 673, 257/666, 693, 779, 737

(56) References Cited

U.S. PATENT DOCUMENTS

| | | | | |
|---|---|---|---|---|
| 4,151,543 A | * | 4/1979 | Hayakawa et al. | 257/700 |
| 4,922,322 A | * | 5/1990 | Mathew | 246/737 |
| 5,164,566 A | * | 11/1992 | Spletter et al. | 219/121.63 |
| 5,659,198 A | * | 8/1997 | Okutomo et al. | 257/659 |
| 5,705,858 A | | 1/1998 | Tsukamoto | 257/778 |
| 6,013,953 A | * | 1/2000 | Nishihara er al. | 257/778 |

FOREIGN PATENT DOCUMENTS

| JP | 55-74163 | * | 6/1980 | ............ 257/737 |
|---|---|---|---|---|
| JP | 56-161664 | * | 12/1981 | ............ 257/737 |

* cited by examiner

Primary Examiner—Jhihan B Clark
(74) Attorney, Agent, or Firm—McDermott, Will & Emery

(57) ABSTRACT

A semiconductor device, comprising: a semiconductor chip having on its main plane a plurality of external electrodes each having a joining portion; an insulating substrate having a predetermined pattern of leads thereon and having no device hole for said semiconductor chip, each of said leads being provided with an inner lead having a joining portion which is joined through solder to a corresponding one of the joining portions of said external electrodes of said semiconductor chip to provide a joined portion; and a molding resin for sealing said joined portion including the solder, wherein the joining portion of the external electrode comprises a metal selected from the group consisting of gold and tin, the joining portion of the inner lead comprises a metal selected from the group consisting of gold and tin, provided that, when the metal constituting the joining portion of the external electrode is gold, the metal constituting the joining portion of the inner lead is tin, or vice versa, and the solder comprise gold/tin solder. This constitution contributes to an improved in reliability with respect to temperature cycling in lead-patterning substrates, semiconductor devices, and electronics devices.

14 Claims, 23 Drawing Sheets

FIG.8A
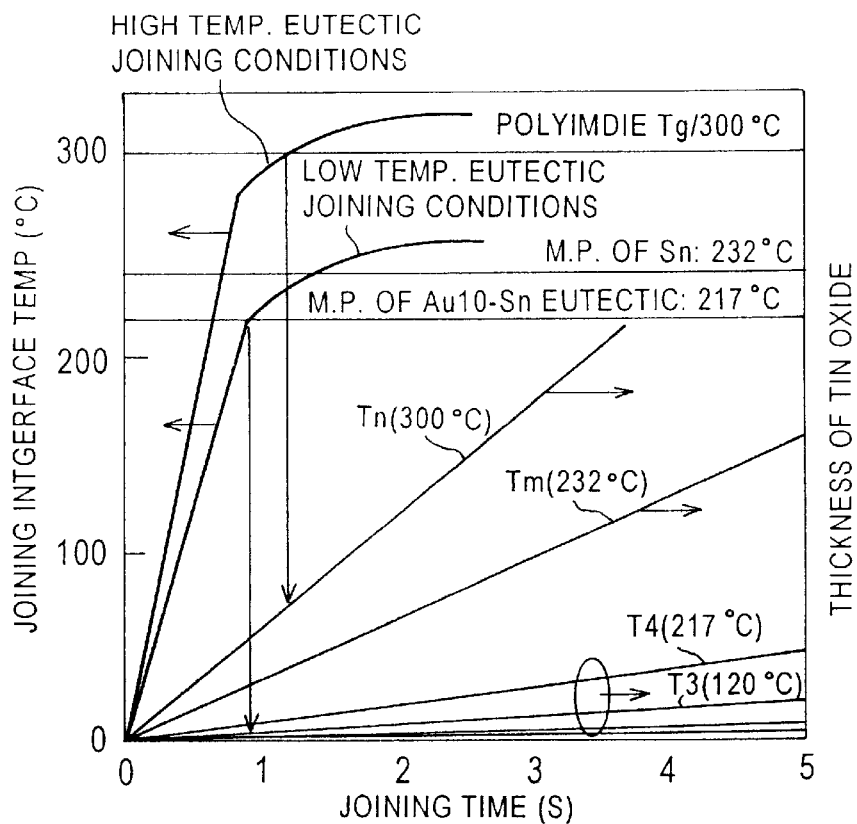
FIG.8B
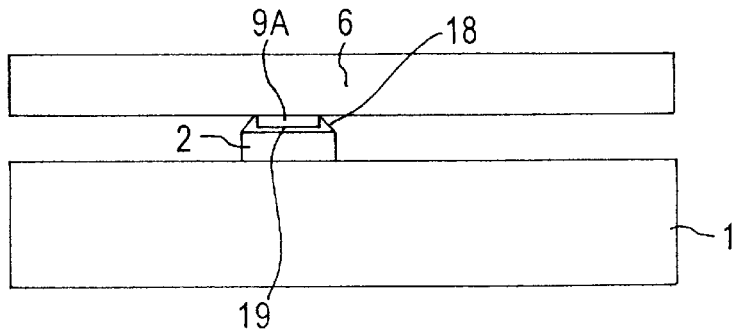
FIG.8C
| | COMPOSITION(WT%) | | |
|---|---|---|---|
| | Au | Sn | Cu |
| 18 | 5~20 | 80~95 | (5<) |
| 19 | 10~40 | 60~90 | (5<) |

SEMICONDUCTOR DEVICE, LEAD-PATTERNING SUBSTRATE, AND ELECTRONICS DEVICE, AND METHOD FOR FABRICATING SAME

FIELD OF THE INVENTION

The invention relates to a semiconductor device, a lead-patterning substrate, and an electronics device, and methods for fabricating the same, and more particularly to a technique which can be usefully applied to joining by gold/tin soldering and an improvement in reliability of the joined portion, in conjunction with joining between external electrodes (bonding pads), arranged on the main plane of a semiconductor chip having an LOC (Lead on chip) structure, and inner leads of a lead-pattern layer on a lead-patterning substrate.

BACKGROUND OF THE INVENTION

A conventional semiconductor device mounted on a TCP (tape carrier package) type lead-patterning substrate is shown in FIGS. 1A and 1B and FIGS. 2A and 2B. FIGS. 1A and 1B are diagrams showing an example of the semiconductor device for MPU, CPU and the like of four-directional terminals, wherein FIG. 1A is a plan view and FIG. 1B is a cross-sectional view. FIGS. 2A and 2B are diagrams showing the relationship between a lead frame and a semiconductor chip regarding an example of the semiconductor device for IC of a liquid crystal panel, wherein FIG. 2A is a plan view and FIG. 2B is a cross-sectional view. As is apparent from FIGS. 1A and 1B and FIGS. 2A and 2B, TCP 27 has such a structure that a semiconductor chip 1 is connected to a device hole 28 of a TAB (tape automated bonding) tape (a flexible lead-patterning board) 6 through an inner lead 9 and packaged by a molding resin 26.

The TAB tape (flexible lead-patterning substrate) 6 comprises a base film 4, made of a polyimide resin or the like, a pattern layer 3, an inner lead 9, and an outer lead 8. TCP 27 is mounted on a circuit board 5 through an outer lead 8. In general, an external electrode 2 comprising a salient bump is formed on the semiconductor chip 1 in its main plane. This aims to facilitate the joining between the semiconductor chip 1 and the inner lead 9 and to enhance the reliability of the joined portion. Numeral 7 designates a sprocket hole of the TAB tape 6, and numeral 29 designates a lead terminal on the circuit board 5.

The bump of the external electrode 2 is generally constituted by an about 20 μm-thick electroplating. The inner lead 9 is electrolessly plated with 0.2 to 0.3 μm-thick tin. The tip of the inner lead 9 is generally connected to a pad 2 of the gold bump by means of a high-temperature tool at 500° C. This is because the melting point 285° C. of a eutectic composition comprising 90% by weight of gold with the balance consisting of tin in an equilibrium diagram for gold and tin is utilized. At a tool temperature of 500° C., a reaction layer having a eutectic composition comprising 90% by weight of gold with the balance consisting of tin is thickly grown in the joining interface, realizing strong joining strength.

A tool having a temperature of 500° C. is used in order to realize the completion of joining in a short time of about 2 sec. Since the melting point of tin is 232° C., joining under conditions of a heating tool temperature of about 240° C. and an increase of the joining time to about 10 sec is possible. In this case, however, since the joining is achieved by mutual diffusion between molten tin and gold, the diffusion layer is thin with the joining strength being very low. The solder layer at that temperature comprises 50 to 80% by weight of gold with the balance consisting of tin. In this solder system, therefore, the temperature around 500° C. should be set. This temperature is too high for a polyimide film having a Tg of about 300° C.

However, protrusion of the inner lead 9 from the device hole and a joining time of about 2 sec permit the polyimide film to withstand without burning. The inner lead 9 is generally prepared by photochemically etching a copper foil and then conducting electroless plating with tin. The number of external electrodes 2 comprising a gold bump in the semiconductor chip 1 is generally about 100 to 500 pins. Joining methods are classified into a method wherein all pins are joined at once in a short time of about 2 sec and a single point bonding method wherein the inner lead 9 is joined one by one in a time of about 0.2 sec/lead.

In the case of single point bonding for 500 pins, a long joining time of about 100 sec is necessary. Therefore, the single point bonding is not extensively used for mass production. The outer lead 8, after bending in the direction of the substrate, is connected to a lead pattern 29 of the circuit board 5 by print reflow of a eutectic solder paste of 63Sn/37Pb or the like.

Gold/tin joining has hitherto been carried out using a eutectic composition (melting point 278° C.) having a gold content around 90% by weight. This temperature is a joining temperature posing no problem in an inorganic package, such as a ceramic package. However, it is too high for CSP comprising an organic film material, such as a polyimide. This gold/tin joining technique is disclosed, for example, in Quarterly Journal of the Japan Welding Society, 15 (1), pp. 174 (1997).

The inventors of the invention have examined the prior art technique and have found the following problems.

(1) The temperature of joining between the semiconductor chip 1 and the inner lead 9 is so high that the inner lead 9 should be connected in the state of protrusion from the device hole 28. For this reason, the provision of a device hole 28 is indispensable.

If an external electrode 2 comprising a gold bump in the semiconductor chip 1 is directly abutted against the lead pattern 29 on the base film 4 of polyimide without the formation of a device hole followed by joining while applying a high-temperature tool of 500° C., the polyimide resin film would be burned and carbonized, making it impossible to produce a TCP package with good reliability.

This device hole 28 is formed in a polyimide film 4 with an adhesive applied thereto by means of a punching die. The die is expensive, and, in addition, the formation of a hole in the film 4 unfavorably results in lowered tensile strength of the film 4.

(2) As described above, the temperature of the tool for the joining is so high that, when a device hole 28 is formed to form an inner lead 9, the following problem occurs. Due to good thermal conductivity of the inner lead 9 of copper, an increase of the temperature slightly above 500° C. for satisfactory joining or a slight prolongation of the joining time causes heat to be conducted through the inner lead, leading to a problem that the polyimide film 9 and the adhesive are burned and carbonized.

The adhesive generally comprises an epoxy resin and has a Tg of about 170° C. This has inferior heat resistance to the polyimide and, hence, still has a problem as an adhesive for high-temperature joining. An additional problem is that, when the joining time is shortened in consideration of a problem of damage to the adhesive, a failure of joining occurs making it impossible to provide normal joining strength. Further, designing a joining tool for use at 500° C. requires a very high level of technique.

Specifically, in joining at once, the flatness of the joining tool is very important from the viewpoint of a failure of the semiconductor chip 1. However, the influence of the thermal expansion is very large at 500° C., and considerable know-how regarding the fabrication is necessary for the maintenance of the flatness at that temperature. When the flatness of the tool is low, uneven stress is applied to the semiconductor chip 1, often leading to a failure of the semiconductor chip 1. In general, a tool flatness of not more than 1 μm is required. In this case, the total cost including the cost of the heating tool and the cost of the stage just under the semiconductor chip 1 is, for example, as high as not less than 1,000,000 yen. This is because heat is transmitted to the stage just under the semiconductor chip 1, rendering the regulation of the flatness of the stage important. Further, the tool temperature used is so high that a design of machine parts in a large sheet thickness and the like are necessary for maintaining the peripheral mechanical accuracy, resulting in increased whole cost of the joining machine.

(3) Flexibility is particularly important for the TAB tape 6. In the prior art technique, however, the film 4 becomes thick because an adhesive is used. Further, since the adhesive per se is a resin, having a high flexural modulus of elasticity, comprising an epoxy resin, a problem of lowered flexibility occurs. In recent years, there is an ever-increasing demand for a reduction in size of domestic electronic appliances, such as portable telephones, leading to a strong demand for a freely bendable TAB tape 6. This low flexibility is a very important issue.

(4) When the device hole 28 is formed to provide an inner lead 9, the base film 4 is not present just under the inner lead 9. Therefore, the inner lead 9 becomes protruded with only one end thereof being supported. In this form of the lead, the tip is very easily bent. This poses a problem of misregistration involved in registration with the external electrode 2 of a gold pad and, in addition, a problem of breaking of leads, and a problem of separation of the semiconductor chip 1 from the joined portion in a period between the completion of the joining and the resin molding attributable to handling associated with transit, resulting in deteriorated reliability.

(5) In conventional semiconductor devices, the guarantee of the reliability in cold districts relies upon a temperature cycling test between −65° C. and 150° C. In this temperature cycling test, for the conventional structure, the protruded inner lead 9 undergoes tension due to thermal stress. Specifically, the coefficient of thermal expansion of the semiconductor chip 1 is 3 ppm/° C., while the coefficient of thermal expansion of the polyimide resin as the base film 4 is 20 ppm/° C. Therefore, stress is concentrated on the copper leads interposed between the semiconductor chip and the base film in the temperature cycling test. In general, in the above temperature cycling test, a reliability of about 1000 cycles is required. For this reason, sealing the periphery with a molding resin 26 has been used. However, there is a limit to the performance of the molding resin 26, and small coverage of the molding resin 26 causes breaking of the lead.

(6) In the prior art method, the number of semiconductor chip 1 mounted on one TAB tape is limited to one. This is because the device hole 28 is necessary. Specifically, when a plurality of device holes 28 are formed to mount a plurality of semiconductor chips 1, the strength of the film 4 becomes low. Further, during joining of the plurality of semiconductor chips 1, the leads of the already joined semiconductor chip 1 are disadvantageously broken at the time of handling. Furthermore, an additional problem involved in mounting of the plurality of semiconductor chips 1 is that the cost of the cutting die for the device hole 28 is increased. For this reason, one semiconductor chip should be mounted for each TAB tape. This makes it impossible to produce high-density flexible lead-pattern substrate, such as multi-chip modules.

Therefore, as shown in FIGS. 1A and 1B, TCP 27 is mounted one by one on the circuit board 5. When multi-chip is desired, a plurality of semiconductor chips 1 should be mounted in this form onto the circuit board 5. This results in an increase in the system cost. FIGS. 2A and 2B shows the structure of a TAB tape used in LCD panels. In LCD, on-off driving of transmitted light by backlight of the liquid crystal panel is carried out by sending a signal from drive IC (semiconductor chip 1). For this, TCP is used in a large quantity. Also in this case, as shown in FIGS. 2A and 2B, the device hole 28 is provided, posing the same problems as described above.

(7) When a non-sealed semiconductor chip is mounted directly onto a lead-patterning substrate of an organic material without through TCP 27, in general, a eutectic solder of 37 wt % Pb—Sn is extensively used in consideration of the heat resistance of the circuit board 5. The melting point of this eutectic composition is 180° C., so that there is no fear of the organic material, such as glass epoxy resin, being damaged. However, the maximum temperature, at which the joined portion can withstand, is so low that the reliability in the above temperature cycling test and a high-temperature (150° C.) holding test are disadvantageously low. Further, when the non-sealed semiconductor chip is mounted together with other components, the joined portion cannot withstand the solder paste print reflow mounting temperature, 250° C. This causes problems including separation of the non-sealed semiconductor chip.

SUMMARY OF THE INVENTION

It is an object of the invention to provide a technique that can improve the reliability with temperature cycling in lead-patterning substrates, semiconductor devices, and electronics devices.

It is another object of the invention to provide a technique that can provide a joining structure with high reliability in lead-patterning substrates, semiconductor devices, and electronics devices.

It is still another object of the invention to a technique that can form at a low temperature a solder layer of a gold/tin solder in joining between a semiconductor chip and inner leads in a semiconductor device.

It is a further object of the invention to provide a technique that can improve the flexibility of a flexible lead-patterning substrate.

It is a still further object of the invention to provide a TAB type flexible lead-patterning substrate that is highly resistant to tension.

A further object of the invention to provide a TAB flexible lead-patterning substrate on which a plurality of semiconductor chips can be mounted.

A still further object of the invention is to provide a chip-size type semiconductor device (CSP type semiconductor device) utilizing a flexible lead layer.

Another object of the invention is to provide a μBGA type semiconductor device having high reliability with respect to temperature cycling.

The above and other objects and novel features of the invention will become apparent from the following description and the accompanying drawings.

According to the invention, the features are summarized as defined below.

(1) A semiconductor device, comprising:

a semiconductor chip having on its main plane a plurality of external electrodes each having a joining portion;

an insulating substrate having a predetermined pattern of leads thereon and having no device hole for said semiconductor chip, each of said leads being provided with an inner lead having a joining portion which is joined through solder to a corresponding one of the joining portions of said external electrodes of said semiconductor chip to provide a joined portion; and a molding resin for sealing said joined portion including the solder, wherein the joining portion of the external electrode comprises a metal selected from the group consisting of gold and tin;

the joining portion of the inner lead comprises a metal selected from the group consisting of gold and tin, provided that, when the metal constituting the joining portion of the external electrode is gold, the metal constituting the joining portion of the inner lead is tin, or vice versa; and the solder comprises gold/tin solder.

(2) A semiconductor device, comprising:

a semiconductor chip having on its main plane a plurality of external electrodes each having a joining portion;

a flexible lead-patterning substrate comprising an insulating, flexible base film having a first plane and a second plane, the first plane having thereon leads each having a joining portion for joining to the semiconductor chip and provided with an inner lead portion electrically connected to the joining portion of said leads, the second plane having therein via holes and joining portions for solder balls, each of the joining portions, for solder balls, being electrically connected through a corresponding one of the via holes to a corresponding one of the inner lead portions and having thereon a solder ball, the external electrodes each in its joining portion being joined through solder to a corresponding one of the joining portions, for the semiconductor chip, provided on the first plane of the base film to form a joined portion; and a molding resin for sealing said joined portion including the solder, wherein the joining portion of the external electrode comprises a metal selected from the group consisting of gold and tin;

the joining portion of, for the semiconductor chip, provided on the first plane of the base film comprises a metal selected from the group consisting of gold and tin, provided that, when the metal constituting the joining portion of the external electrode is gold, the metal constituting the joining portion provided on the first plane of the base film or is tin, or vice versa; and the solder comprises gold/tin solder.

(3) A semiconductor device, comprising:

a semiconductor chip having on its main plane a plurality of external electrodes each having a joining portion;

a lead-pattering substrate comprising leads provided on an insulating, flexible base film, each of the leads having an inner lead being provided with an inner lead having a joining portion which is joined through solder to a corresponding one of the joining portions of said external electrodes of said semiconductor chip to provide a joined portion;

solder balls electrically connected respectively onto the leads;

a thermal stress cushioning material elastomer for relaxing thermal stress with respect to the semiconductor chip and the leads; and a molding resin for sealing said joined portion including the solder, wherein the joining portion of the external electrode comprises a metal selected from the group consisting of gold and tin;

the joining portion of the inner lead comprises a metal selected from the group consisting of gold and tin, provided that, when the metal constituting the joining portion of the external electrode is gold, the metal constituting the joining portion of the inner lead is tin, or vice versa; and the solder comprises gold/tin solder.

(4) The joined portion comprises a solder layer of a gold/tin solder, the solder layer comprising: a fillet which mainly has a composition having a first eutectic point (melting point 217° C.) comprising 5 to 20% by weight of gold with the balance consisting of tin; and a reaction fusion layer (a high melting layer) comprising 20 to 40% by weight of gold with the balance consisting of tin.

(5) The solder layer of gold/tin solder comprise not more than 1.0% by weight of lead as a minor additive element in addition to gold and tin.

(6) The solder layer of gold/tin solder comprises, in addition to gold and tin, a diffusion-dissolved base metal element from the joined metal base.

(7) The joining portion of the external electrode comprises any one of a thick electrolytic gold plating in a bump form, an electroless gold plating, a deposited gold layer, a sputtered gold layer, and a thin gold coating provided on a salient (a bump) of a thick nickel, chromium, copper or other metallic plating.

(8) The joining portion of the inner lead comprises any one of an electrolytic gold plating, an electroless gold plating, a deposited gold layer, and a sputtered gold layer.

(9) The joining portion of the external electrode comprises any one of a thick electrolytic tin plating in a bump form, an electroless tin plating, a deposited tin layer, a sputtered tin layer, and a thin tin plating provided on a thick bump (a bump) of a nickel, chromium, copper or other metallic plating.

(10) The joining portion of the inner lead comprises any one of an electrolytic tin plating, an electroless tin plating, a deposited tin layer, and a sputtered tin layer.

(11) The joining portion of the external electrode comprises a thick salient gold or tin coating, or a gold or tin coating provided on a salient of a metal other than gold or a heat-resistant organic material.

(12) The lead-patterning substrate comprises any one of a copper lead-pattering glass epoxy substrate, a copper lead-patterning glass polyimide substrate, a copper lead-patterning BT resin, a copper lead-patterning fluororesin substrate, a copper lead-patterning aramid substrate, a copper lead-patterning ceramic substrate, a copper lead-patterning (or titanium oxide lead-patterning) glass substrate, a copper lead-patterning polyimide film, a copper lead-patterning liquid crystal polymer, and a copper lead-patterning glass epoxy film.

(13) An electronics device, comprising a Rambus type semiconductor device module, the Rambus type semiconductor device module comprising a plurality of semiconductor devices, according to any one of the above items (1) to (12), mounted on a Rambus type lead-patterning substrate.

(14) A TAB type flexible lead-patterning substrate, comprising a predetermined pattern of leads provided on an insulating, flexible film having no device hole, wherein the lead comprises any one of a rolled oxygen-free foil of copper having a high purity of not less than 99.99% by weight, a high electrolytic copper foil, a deposited copper layer, and an electroless copper plating.

(15) Each of the leads has an inner portion having a joining terminal to be joined to a corresponding one of external electrodes of a semiconductor chip, wherein joining terminal comprises a tin coating, a gold coating provided directly on the joining terminal, or a gold coating provided through a substrate metal.

(16) The insulating, flexible film comprises a liquid crystal polymer.

(17) A method for fabricating a semiconductor device, comprising the steps of:

previously providing a semiconductor chip having on its main plane a plurality of external electrodes each having a joining portion comprising a metal selected from the group consisting of gold and tin and a lead-patterning substrate comprising a predetermined pattern of leads provided on an insulating substrate, each of the leads being provided with an inner lead having a joining portion comprising a metal selected from the group consisting of gold and tin, provided that, when the metal constituting the joining portion of the external electrode is gold, the metal constituting the joining portion of the inner lead is tin, or vice versa;

conducting registration between the joining portion of each of the external electrodes and the joining portion of a corresponding one of the inner leads;

fixing the semiconductor chip;

heat-pressing the assembly in this state to cause a diffusion reaction of the joining portion of the external electrode with the joining portion of the inner lead to form a joined portion including solder; and sealing the joined portion including the solder with a molding resin, wherein, in joining the external electrode to the inner lead, gold or tin constituting the joining portion of the external electrode is brought into intimate contact with tin or gold constituting the joining portion of the inner lead and the assembly is then subjected to joining with heat pressing under conditions of heating temperature 240 to 260° C. (first eutectic point: 217° C.), applied pressure 1 to 10 kgf/mm$^2$, and heat pressing time 2 to 3 sec to form gold/tin solder as a result of a diffusion reaction.

(18) The joining portion, of the external electrode, comprising gold or tin and the joining portion, of the inner lead comprising tin or gold are formed by electrolytically or electrolessly plating any one of a salient copper and copper, chromium, and nickel layers with gold or tin.

(19) The joining between the semiconductor chip and the lead-patterning substrate is carried out, without providing a device for the semiconductor chip in the lead-patterning substrate, by joining the joining portion of the inner lead to the joining portion of the external electrode of the semiconductor chip by means of a bonding tool.

(20) The semiconductor device is mounted directly as a non-sealed semiconductor chip onto a circuit board, or alternatively is once mounted on an intermediate substrate (an interposer) followed by formation of solder balls.

(21) A method for fabricating a flexible lead-patterning substrate, comprising the steps of:

forming a foil of high-purity copper on a first plane of an insulating, flexible film;

etching the copper foil to form a joining portion for joining to a semiconductor chip and an inner lead portion electrically connected to the joining portion for joining to a semiconductor chip;

forming a via hole in a second plane of the insulating film by means of a laser beam to exposure the backside, comprising the copper foil, of the inner lead portion;

forming an electroless copper plating thereon to form a joining portion, for a solder ball, electrically connected to the inner lead portion through the electroless copper plating on the second plane of the insulating film;

forming a solder ball on the joining portion for a solder ball.

(22) A semiconductor device, comprising:

a semiconductor chip having on its main plane a plurality of external electrodes each having a joining portion;

an insulating substrate having a predetermined pattern of leads thereon and having no device hole for said semiconductor chip, each of said leads being provided with an inner lead having a joining portion which is joined through solder to a corresponding one of the joining portions of said external electrodes of said semiconductor chip to provide a joined portion; and a resin layer, formed from a resin coating or a resin tape, for sealing said joined portion including the solder, wherein the joining portion of the external electrode comprises a metal selected from the group consisting of gold and tin;

the joining portion of the inner lead comprises a metal selected from the group consisting of gold and tin, provided that, when the metal constituting the joining portion of the external electrode is gold, the metal constituting the joining portion of the inner lead is tin, or vice versa; and the solder comprises gold/tin solder.

(23) The solder layer comprising: a fillet which mainly has a composition having a first eutectic point (melting point 217° C.) comprising 5 to 20% by weight of gold with the balance consisting of tin; and a reaction fusion layer (a high melting layer) comprising 10 to 40% by weight of gold with the balance consisting of tin.

(24) A method for fabricating a semiconductor device, comprising the steps of:

previously providing a semiconductor chip having on its main plane a plurality of external electrodes each having a joining portion and a lead-patterning substrate comprising a predetermined pattern of leads provided on an insulating substrate having no device hole for semiconductor chip, each of the leads being provided with an inner lead having a joining portion;

forming a resin layer of a resin coating or a resin tape on the inner leads of the leads;

conducting registration between the joining portion of each of the external electrodes and the joining portion of a corresponding one of the inner leads;

fixing the semiconductor chip onto the resin layer; and heat-pressing the assembly in this state to cause a diffusion reaction of the joining portion of the external electrode with the joining portion of the inner lead to form a joined portion of a solder layer comprising a gold/tin eutectic alloy and, at the same time, melting the resin layer to seal the joined portion including the gold/tin eutectic alloy with the resin.

(25) A gold layer or a tin layer is formed on the joining portion of the external electrode and on the joining portion of the inner lead, provided that, when a gold layer is formed on the joining portion of the external electrode, a tin layer is formed on the joining portion of the inner lead, or vise versa; the gold layer is brought into intimate contact with the tin layer; and the assembly is then subjected to joining with heat pressing under conditions of heating temperature 240 to 260° C. (first eutectic point: 217° C.), applied pressure 1 to 10 kg/cm$^2$, and heat pressing time 2 to 5 sec to form a solder layer comprising a gold/tin eutectic alloy as a result of a diffusion reaction.

BRIEF DESCRIPTION OF THE DRAWINGS

The invention will be explained in more detail in conjunction with the appended drawings, wherein:

FIGS. 8A, 8B, and 8C are diagrams showing the principle of a gold/tin joining method according to the invention;

DESCRIPTION OF THE PREFERRED EMBODIMENTS

Figure 1A:
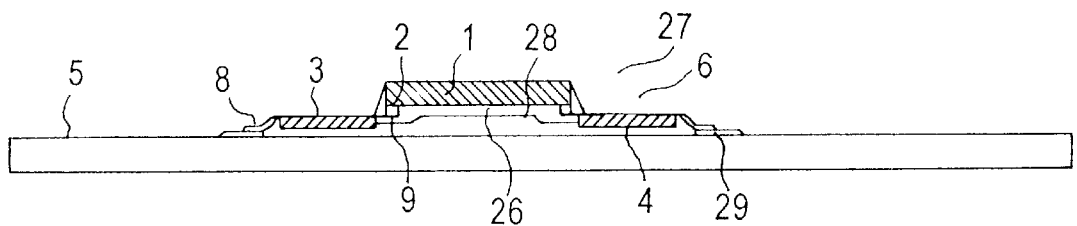
FIGS. 1A and 1B are diagrams showing a conventional semiconductor device mounted on a TCP type lead-patterning substrate.
Figure 1B:
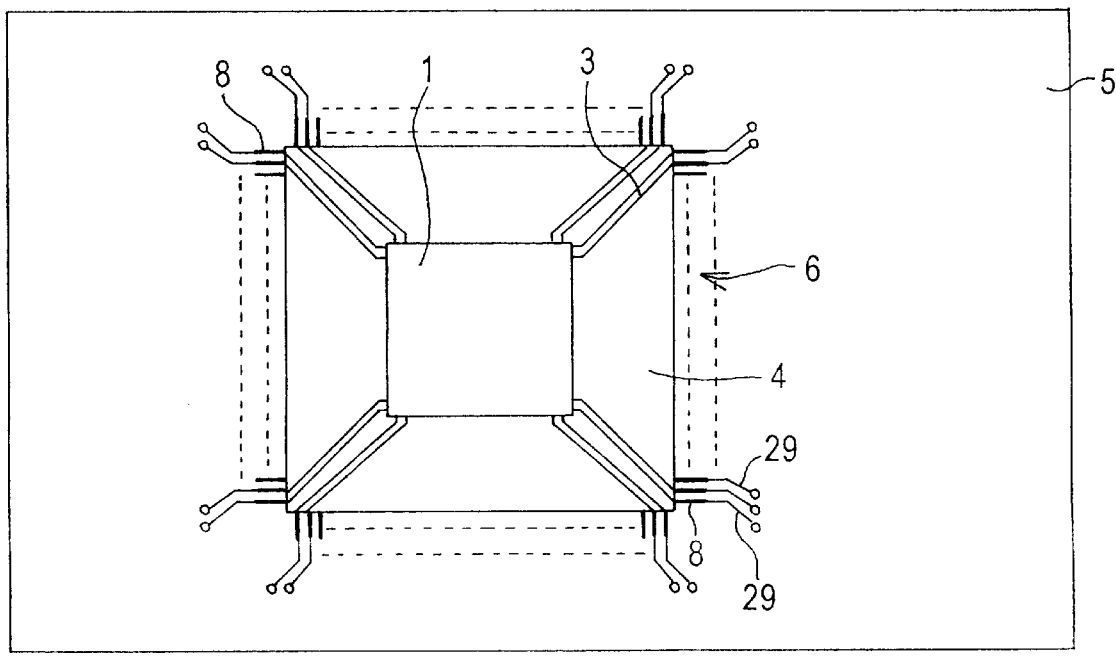
Figure 2A:
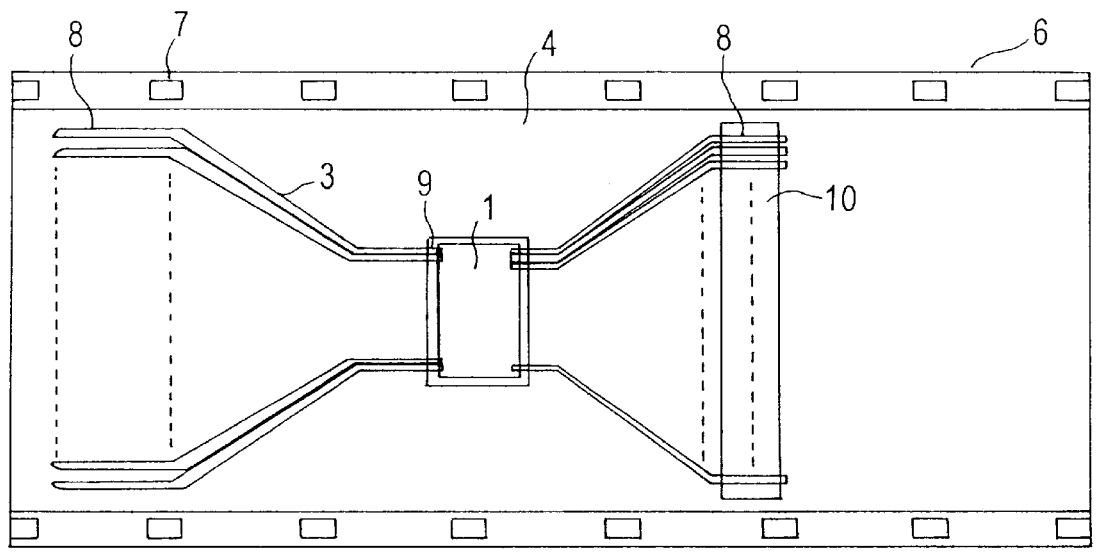
FIGS. 2A and 2B are diagrams showing the structure of a TAB tape used in conventional LCD panels.
Figure 2B:
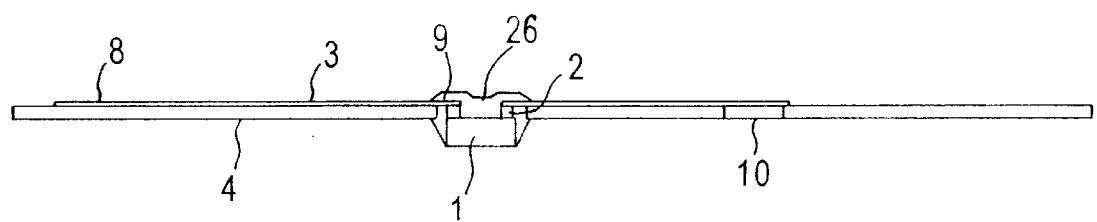

Preferred embodiments of the invention will be explained in more detail with reference to the accompanying drawings. Like parts are identified with the same reference numerals throughout all of the drawings.

Preferred embodiments of the invention are as follows.

(1) Improved Flexing Resistance of Flexible Lead-patterning Substrate

Use of an adhesive in the flexible lead-patterning substrate is eliminated to improve the flexing resistance. This can reduce the whole film thickness and can contribute to an improvement in flexibility by virtue of the absence of a hard epoxy resin adhesive.

(2) Improved Strength of Flexible Lead-patterning Substrate

Figure 5A:
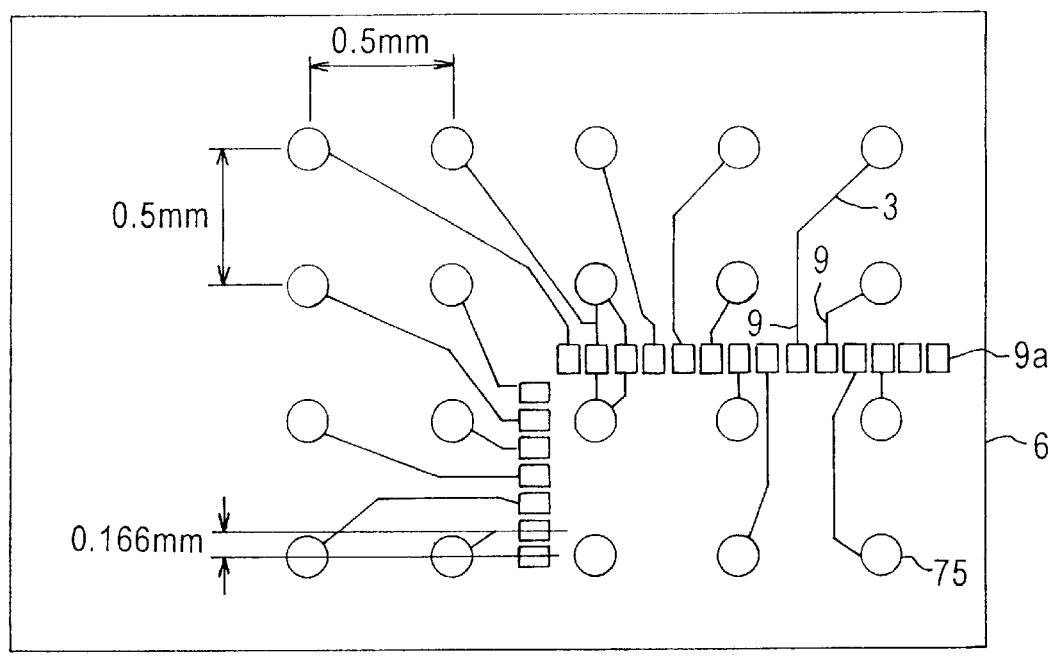
FIGS. 5A and 5B are schematic diagrams showing the construction of a TAB type flexible lead-pattering substrate of Example 1 according to the invention.

Provision of a device hole in the flexible lead-patterning substrate is eliminated to realize a structure that is highly resistant to tensile flexural action. The structure having no device hole is shown in FIG. 5A. The semiconductor chip 1 with external electrodes (gold bumps) provided on the underside thereof is joined to inner leads of a lead pattern on an insulating base film 4 having no device hole. In joining by this method, a heating tool is applied onto the backside of a film of an organic material, such as polyimide, as the base film 4. Therefore, in this case, a joining structure is important which permits joining at a heating tool temperature of 250° C. or below.

In the prior art, eutectic soldering (37Pb—63Sn) is used from the viewpoint of the problem associated with the joining temperature. As described above, this joining method has the following problems.

(i) Since the melting point of the eutectic solder is as low as 180° C., the joined portion is separated in a high-temperature atmosphere. Filling of a resin into the joining interface after the joining and other measures are taken to prevent this unfavorable phenomenon.

(ii) In a reliability test in a high-temperature (150° C. or above) atmosphere, the eutectic texture of the solder is coarsened and oxidized, resulting in lowered joining strength. In this test, the joined portion can generally withstand only 200 hr at 150° C.

(iii) When a flexible lead-patterning substrate joined onto the base film is further mounted on a circuit board, a solder reflow oven generally having a temperature of 230 to 250° C. is used. The joined portion is separated at that temperature.

(iv) In the eutectic soldering (37Pb—63Sn), the fluidity of the solder is so good that shortcircuitting between leads is likely to occur, rendering microsoldering difficult.

In order to solve this problem, the inventors of the invention adopted a gold/tin solder structure having a high tin content region of 60 to 90% by weight (gold 10 to 40% by weight).

For the lead pattern formed on the insulating base film (polyimide film) 4 and the inner leads 9 extended from the leads, a 0.5 to 0.7 μm-thick tin plating is provided on the copper leads. For the external electrodes (gold bumps) of the semiconductor chip 1, a 10 to 20 μm-thick gold plating is provided, or alternatively, a 0.3 to 1.5 μm-thick gold plating is provided on a 10 to 20 μm-thick inexpensive plating (e.g., nickel) bump. According to this plating structure, joining can be carried out by means of a heating tool temperature of 250° C. or below, because the melting point of tin is 232° C. with the first eutectic melting point being 217° C. When the diffusion proceeds and reaches the first eutectic composition (10Au—Sn), the melting point is further lowered below the melting point of tin, thus permitting joining. The time taken for the joining is about 5 sec or less. Even in the case of a semiconductor chip 1 with the number of external electrodes (gold bumps) 2 corresponding to 500 pins, the joining can be achieved within 5 sec.

Figure 9:
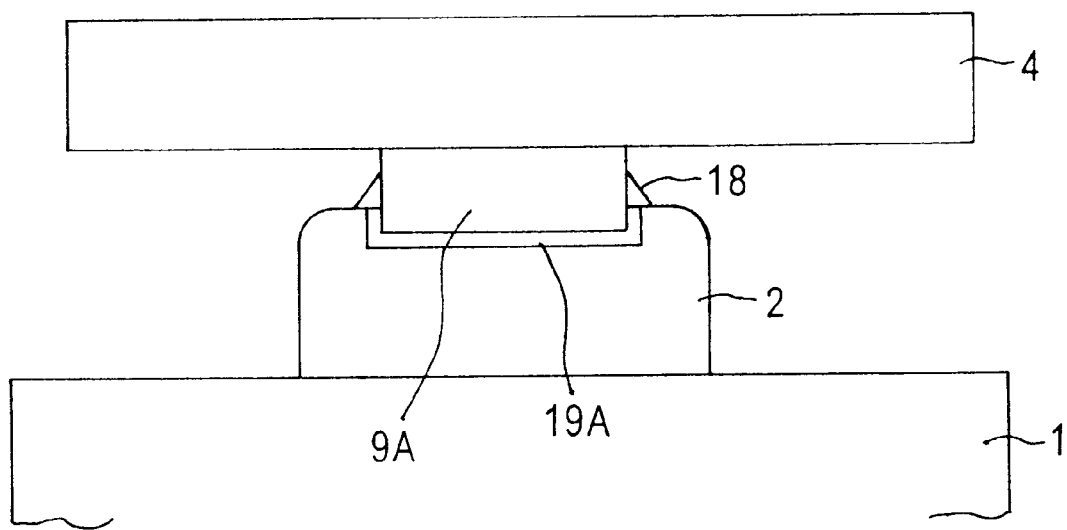
FIG. 9 is a diagram showing gold/tin joining.
Figure 10A:
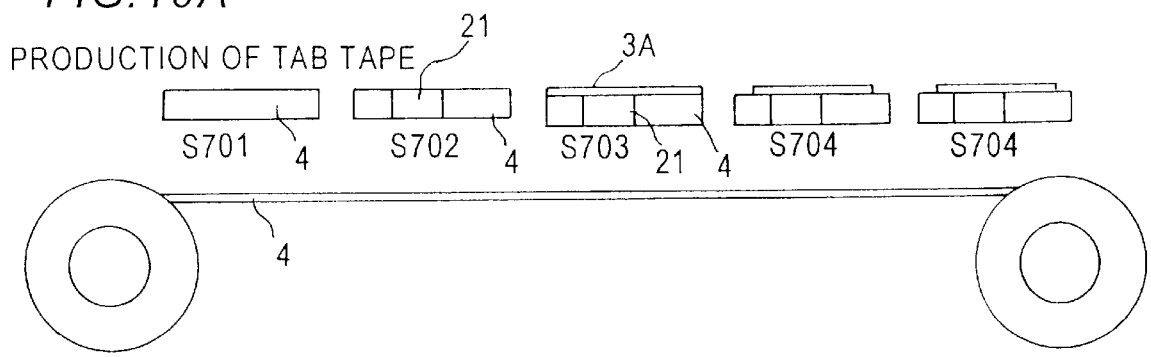
FIGS. 10A to 10D are diagrams showing a method for fabricating a TAB type (TOC type) semiconductor device of Example 1 according to the invention.
Figure 10B:
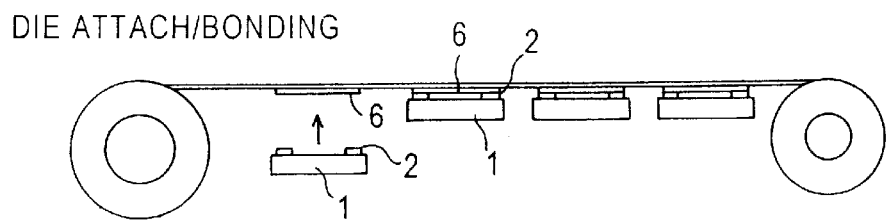
Figure 10C:
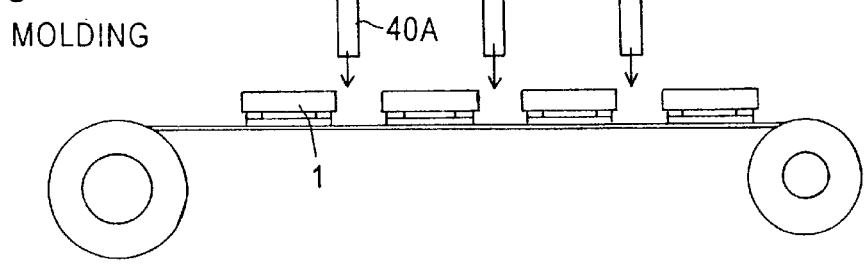
Figure 10D:
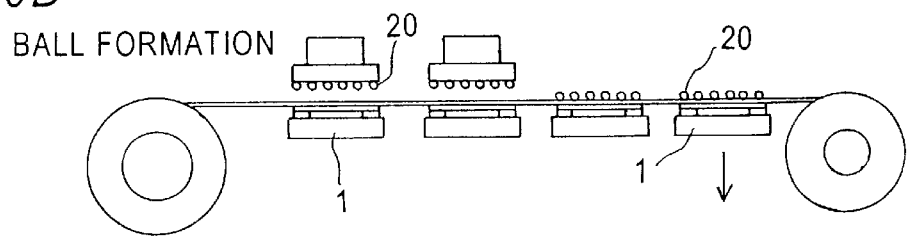
Figure 11A:
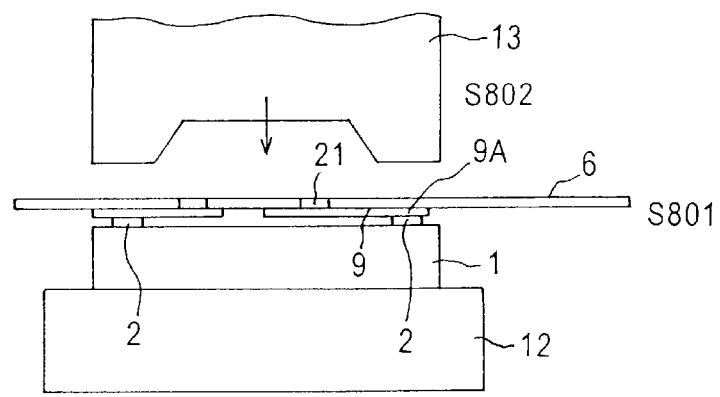
FIGS. 11A to 11D are diagrams showing a method for fabricating a TAB type (TOC type) semiconductor device of Example 1 of the present invention.
Figure 11B:
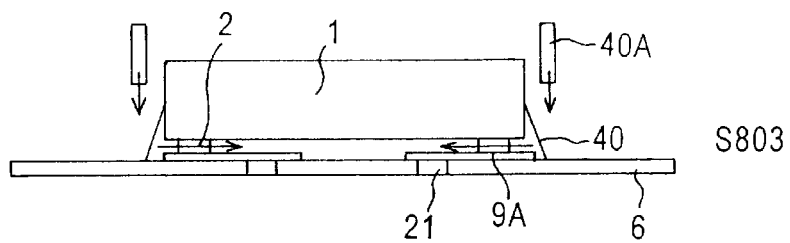
Figure 11C:
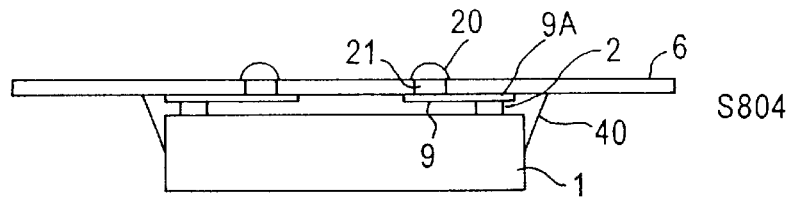
Figure 11D:
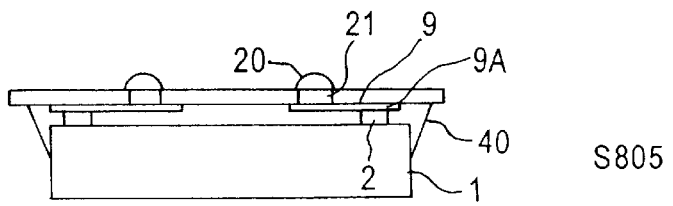

The solder layer of a gold/tin solder shown in FIG. 9 comprises a reaction fusion layer (a high melting layer) 19 of gold and tin and a portion 18 squeezed out therefrom (hereinafter referred to as a "fillet"). As a result of a experiment, it was found that the fillet (eutectic layer) 18 mainly has a composition having a first eutectic point (melting point 217° C.), that is, comprises 5 to 20% by weight of gold with the balance consisting of tin, while the reaction fusion layer (high-melting layer) 19 comprises 10 to 40% by weight of gold with the balance consisting of tin.

The composition comprising 10 to 40% by weight of gold with the balance consisting of tin is considered to be formed as follows. Specifically, a low-melting gold/tin composition is excluded into the outside due to the influence of the heating tool with a load applied thereto, and, thereafter, gold is diffused into the reaction fusion layer (high-melting layer).

The reaction fusion layer (high-melting layer) 19 has a high gold concentration, and the maximum temperature, at which the reaction fusion layer can withstand, is 300° C. The fillet 18 located on the outside of the reaction fusion layer covers the side face and hence can serve to mechanically increase the joining strength at a temperature of 217° C. or below. As described above, structures of external electrodes (gold bumps) 2 of the semiconductor device 1 usable herein include one wherein a nickel plating is plated with gold, one wherein a gold plating is provided on a plating (e.g., copper) bump (salient), and one wherein a gold plating is provided on a plating (e.g., chromium) bump. In this connection, it should be noted that the thickness of gold and the thickness of tin should be at least such that gold and tin can be reacted with each other. For example, the thickness is preferably 0.1 μm or more for gold, and 0.5 to 0.7 μm for the tin plating.

(3) The structure has no device hole. Therefore, leads can be freely provided on the flat base film 4, offering a high freedom for mounting of multichip leads. Specifically, a lead can be extended just under the mounted semiconductor chip 1, permitting the lead length to be shortened. In addition, the lead extension area is so large that the area of the lead-patterning substrate can be reduced, contributing to a reduction in size of electronic equipment. Further, the pattern can be freely provided by virtue of absence of the device hole, permitting solder balls to be disposed just under the chip and around the chip. Specifically, in the conventional structure having a device hole, the ball cannot be of course provided on the portion of the device hole. Further, the lattice pitch of the balls should be varied in this portion. Therefore, in BGA packages wherein the ball pitch is specified to 0.3 mm, 0.5 mm or the like, the structure is an off-specification package structure.

(4) The film is located just under the inner lead, so that the stress is not concentrated directly on the inner lead. Therefore, the reliability with respect to temperature cycling is high. Further, the joint has a structure comprising gold and tin, and, hence, the melting point is high and 217° C. which is much above the melting point of 37 wt % Pb—Sb, 180° C. Therefore, a requirement of 100 hr (the joined portion is not broken, and electrical connection is maintained) in a conventional high-temperature holding test at 150° C. in the air can be met.

Figure 18A:
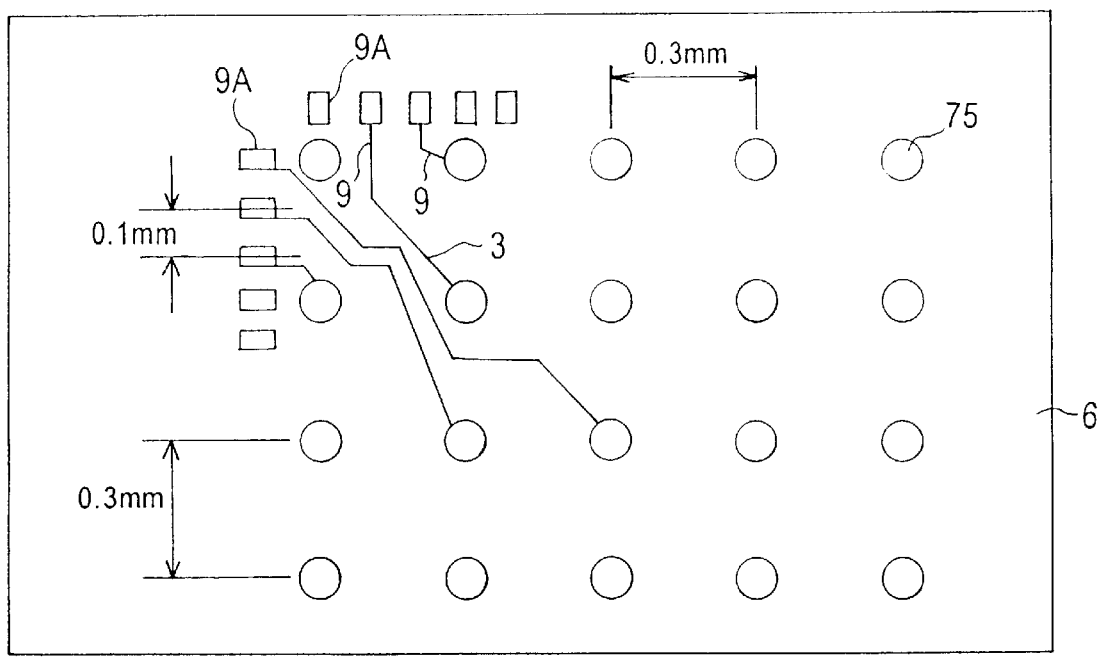
FIGS. 18A and 18B are diagrams showing the construction of a TAB tape used in a CSP type package.
Figure 18B:
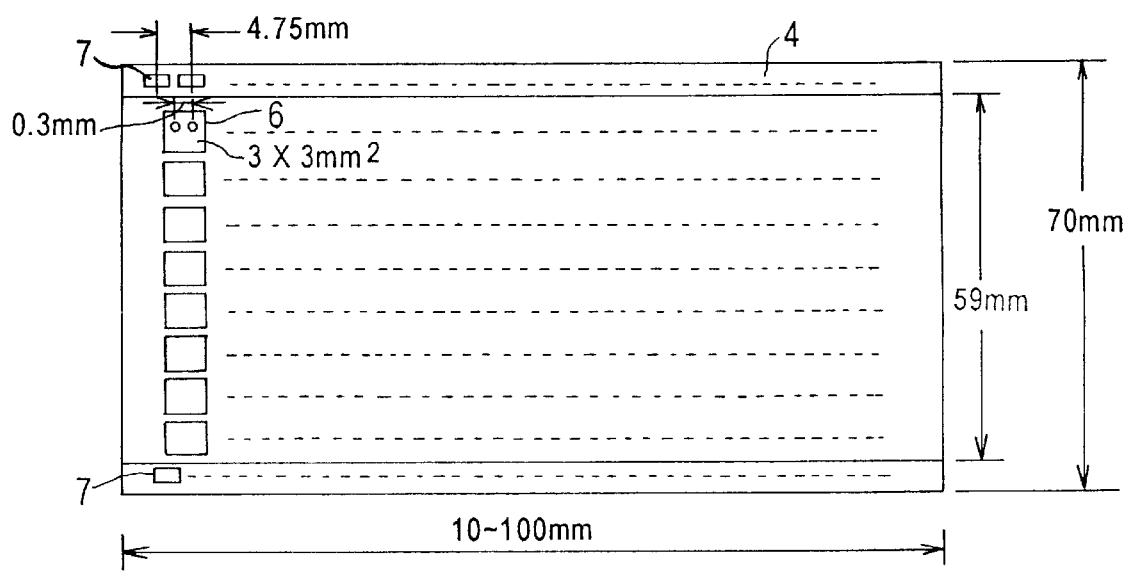

(5) A chip-size package (CSP) type semiconductor device having a structure shown in FIGS. 18A and 18B can be easily prepared. Specifically, a flexible lead-patterning substrate is disposed just under the chip, and external electrodes (gold bump) 2 of the semiconductor chip and the inner leads are joined to each other by the gold/tin soldering according to the present invention. The pattern is extended to the inside of the semiconductor chip 1 and further continued to the lower pattern through the via hole 21, and solder balls are formed respectively on the terminals of the lower pattern.

In the prior art, in this structure, joining using a solder (37 wt % Pb—Sn) has been carried out. This solder, however, has a melting point of 180° C. and hence disadvantageously has poor heat resistance. Further, diffusion joining between gold bumps and gold-plated inner lead has been attempted. This method utilizes ultrasonic joining. Therefore, joining through the film cannot be performed. For this reason, provision of a device hole for exposure of the inner lead is necessary.

The solder ball serves as a terminal for mounting of a circuit board, and this structure is called "BGA." The package having the same size as the semiconductor chip is called "CSP (chip-size package)", and this small package has become rapidly put to practical use for portable electronics devices, such as portable telephones. A solder ball having a eutectic composition of 37Pb—Sn is generally used as the solder ball. The via hole is formed by forming a hole of about 0.05 to 0.3 mmφ in a thin film of an insulating material, such as polyimide, generally having a thickness of about 50 μm by means of a carbon dioxide laser or the like, and conducting copper plating to form a pattern. In this structure, the flexible lead-patterning substrate is very flexible and, hence, when mounted on a circuit board, can absorb thermal stress created due to a difference in coefficient of thermal expansion between the semiconductor chip 1 and the circuit board, offering high reliability with respect to temperature cycling.

(6) Bringing the joining temperature to 250° C. or below enables the mounting of a non-sealed semiconductor chip onto an organic material.

The following examples further illustrate preferred embodiments of the invention.

Example 1

Figure 3A:
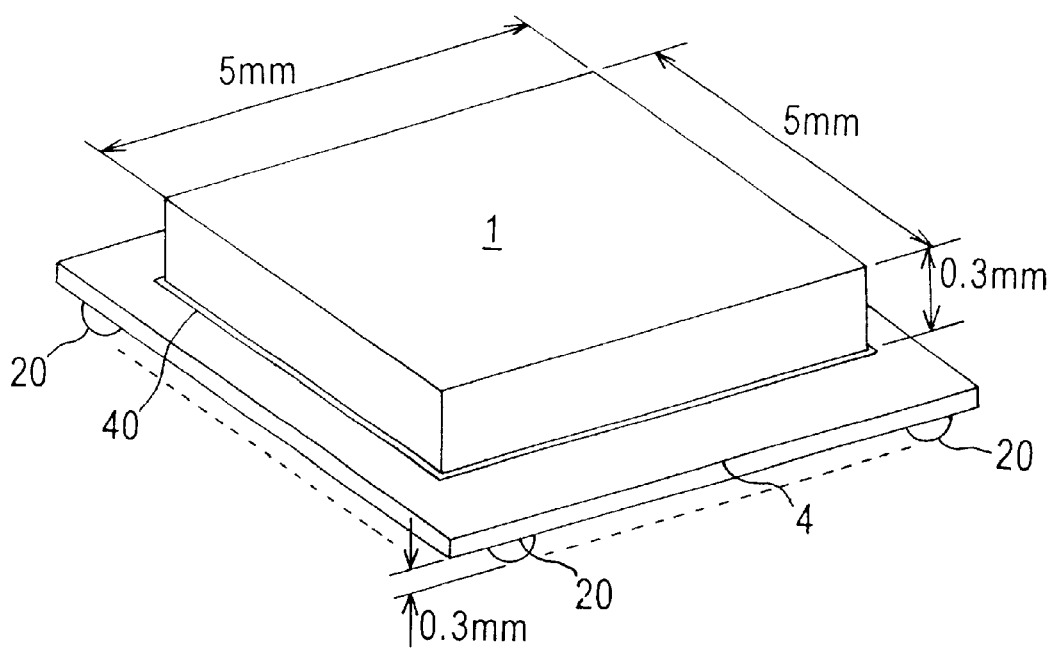
FIGS. 3A and 3B are schematic single views showing the construction of a TAB type semiconductor device of Example 1 according to the invention.
Figure 3B:
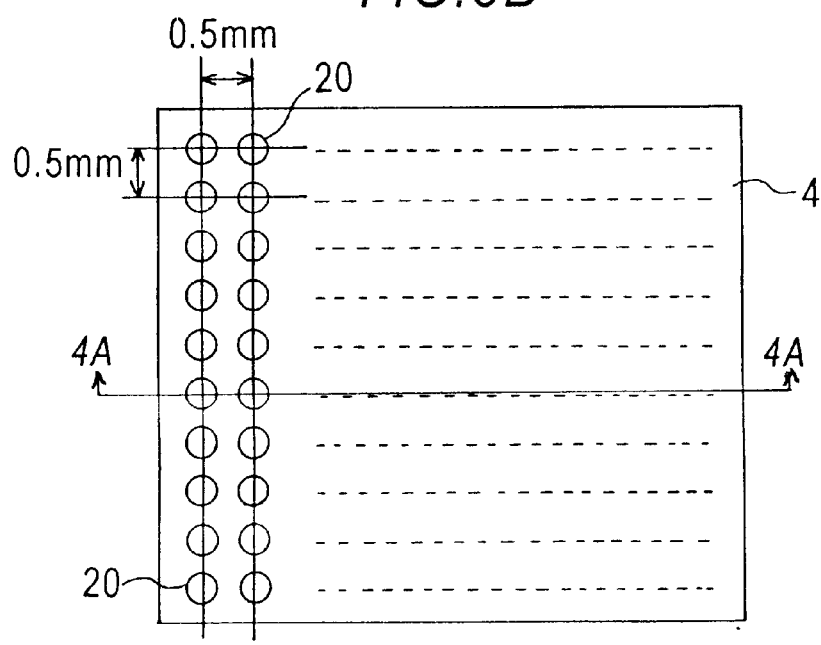
Figure 4A:
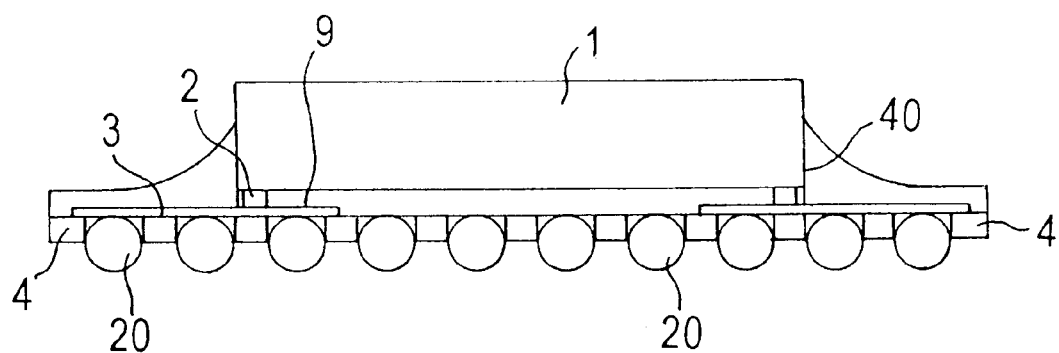
FIG. 4A is a cross-sectional view taken on line 4A—4A of FIG. 3A.
Figure 4B:
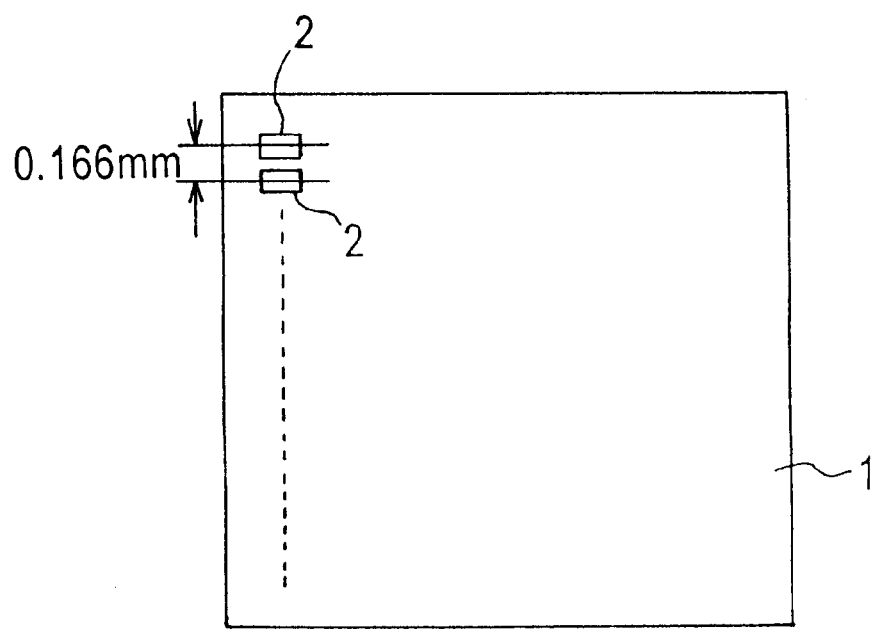
FIG. 4B shows spacing between electrodes.

FIGS. 3A and 3B are schematic single views showing the construction of a TAB type semiconductor device according to Example 1 of the invention, and FIG. 4A is a cross-sectional view taken on line 4A—4A of FIG. 3B.

The TAB type semiconductor device according to Example 1 of the present invention, as shown in FIGS. 3A and 3B and FIGS. 4A and 4B, has such a structure that external electrodes 2 of 100 pins are provided around a semiconductor chip 1. Around the semiconductor chip 1 (a square chip), for each side, external electrodes 2 of 25 pins are arranged at pitches of 0.1 mm (each electrode having a size of 0.08 mm square). In this arrangement, the structure is a fan-in fan-out structure having a chip size of 3 mm×3 mm square and a package size of 5×5 mm (a structure wherein semiconductor electrodes are lead to inner and outer balls). The external electrode (gold bump) 2 was formed by forming a bump (a protrusion) of gold on an external terminal 2 of the semiconductor chip 1. The external terminal of the semiconductor chip 1 has thereon aluminum deposited by a semiconductor circuit formation process. The surface of the aluminum deposit cannot be directly plated with gold. For this reason, a 50 Å-thick titanium layer, a 50 Å-thick chromium layer, a 50 Å-thick copper layer, and a 50 Å-thick nickel layer were successively formed by sputtering onto the aluminum deposit, followed by electroplating with gold to form a gold plating having a thickness of 20 μm, thereby forming a gold bump (an external electrode 2).

Figure 5B:
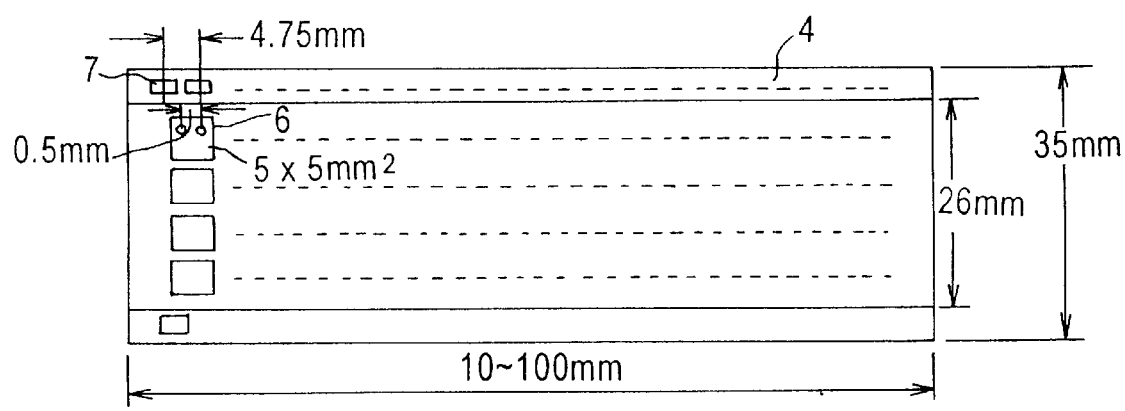

FIGS. 5A and 5B are schematic diagrams showing the construction of a TAB type flexible lead-patterning substrate (hereinafter referred to simply as "TAB tape") according to Example 1.

A TAB tape 6 shown in FIGS. 5A and 5B was used as a substrate for mounting a semiconductor chip thereon. The TAB tape 6, which will be described in detail later, has inner leads 9, land pads 75 for ball formation, and a TAB lead pattern layer 3 connecting between the inner lead and the land pad. The semiconductor chip 1 was mounted on the TAB tape 6 as shown in FIGS. 4A and 4B and FIGS. 5A and 5B. Specifically, the joining portion (tip portion) 9A of the inner lead 9 on the TAB tape 6 was coated with tin, and a gold/tin alloy (an eutectic solder) was formed by a diffusion reaction of gold in the external electrode 2 with tin coated on the joining portion 9A of the inner lead 9. The solder layer in the gold/tin joined portion utilizing the gold/tin alloy comprises a reaction fusion layer (a high melting layer) 19 of gold and tin and a portion (a fillet) 18 squeezed out from the fusion layer. An experiment has revealed that the fillet 18 mainly has a composition having a first eutectic point (melting point 217° C.), that is, comprises 5 to 20% by weight of gold with the balance consisting of tin, while the reaction fusion layer (high melting layer) 19 comprises 10 to 40% by weight of gold with the balance consisting of tin.

Figure 6:
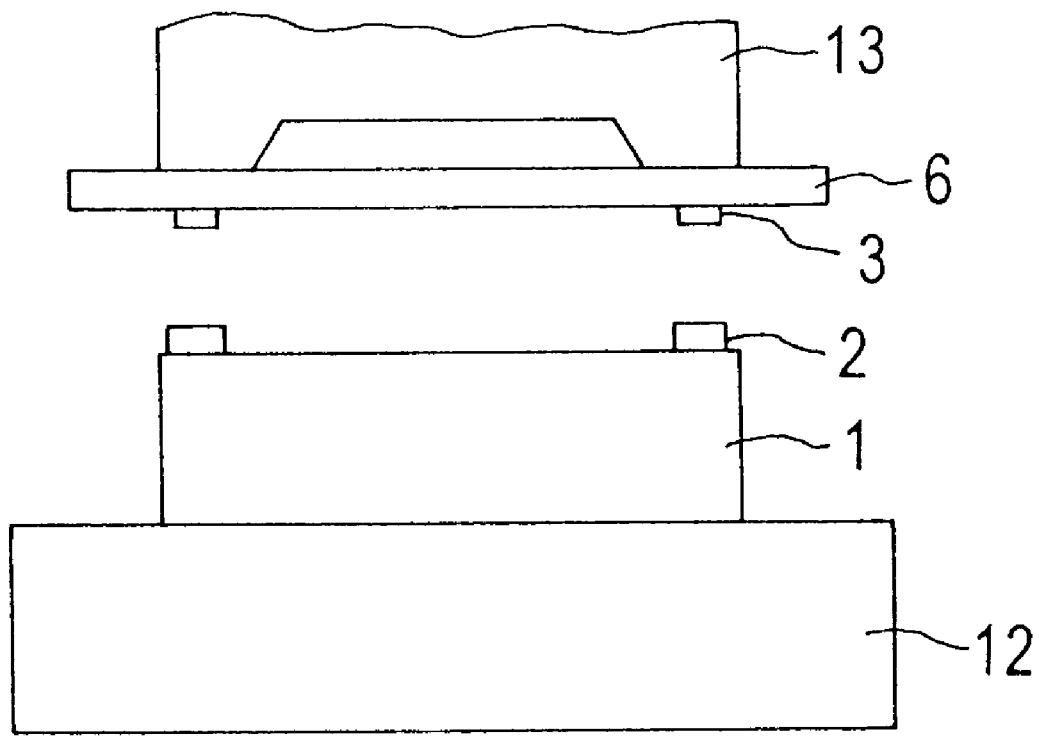
FIG. 6 is a diagram showing a method for mounting a semiconductor chip on a TAB tape.

In mounting the semiconductor chip 1 onto the TAB tape 6, as shown in FIG. 6, a pressure joining tool is applied to the backside of the TAB tape 6, followed by heating. A heat source is mainly provided on the semiconductor chip side 1, and heat is supplied from the semiconductor chip side. The pressure applied is regulated on the flex side. In this case, the film thickness is 50 μm, and the modulus of elasticity of the film at a joining temperature around 200° C. or above is generally as small as 100 MPa, leading to an advantage that a high flatness is not required of the pressure tool.

Figure 7:
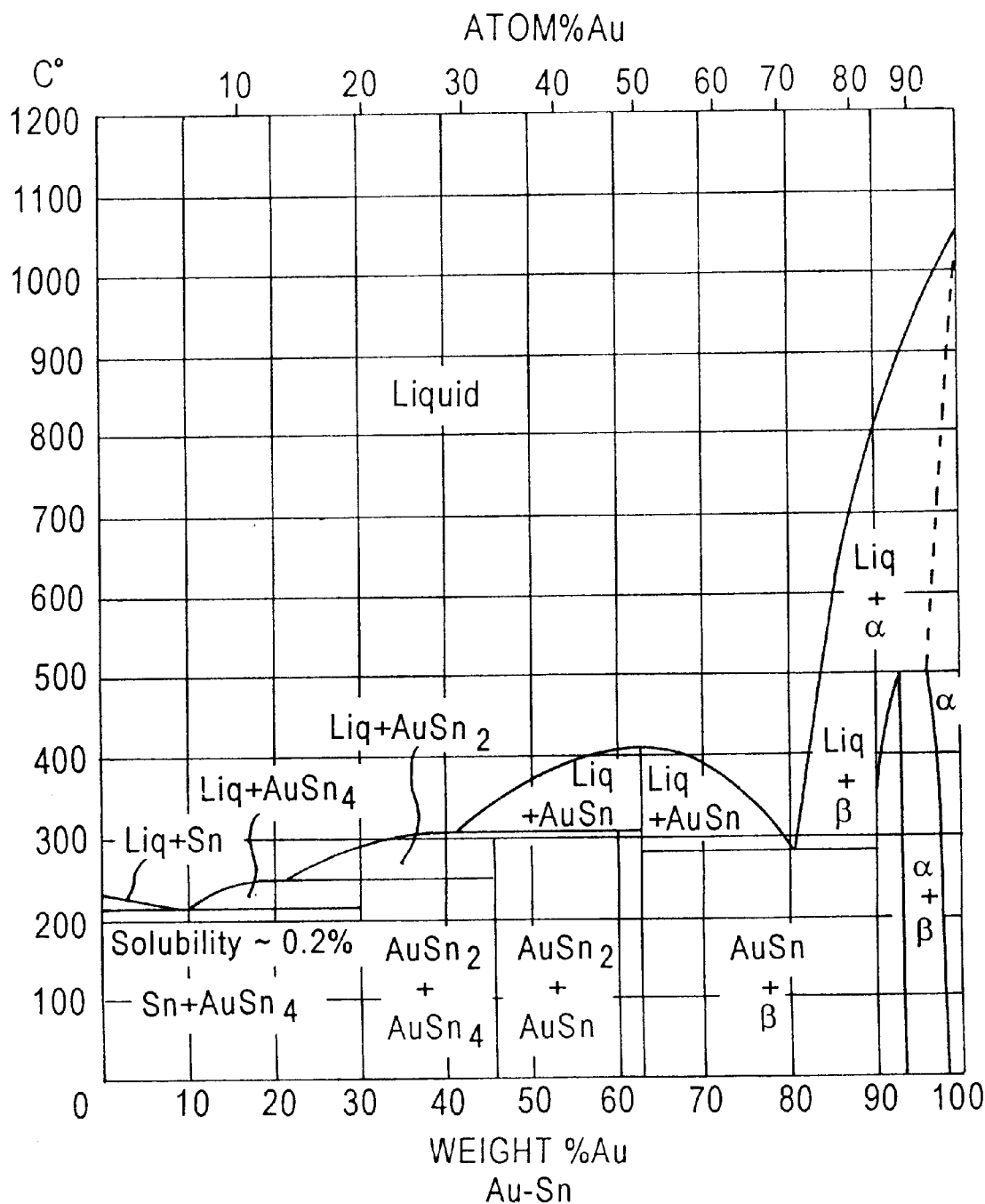
FIG. 7 is an equilibrium diagram for a gold/tin system.

The gold/tin joining method according to the invention will be explained in more detail with reference to FIG. 7 showing an equilibrium diagram on a gold/tin system. Gold/tin soldering has hitherto been carried out utilizing a eutectic composition comprising about 90% by weight of gold (melting point 278° C.). This temperature is a joining temperature that poses no problem in an inorganic package, such as a ceramic package. However, the temperature is too high for CSP comprising an organic film material of polyimide or the like. For this reason, in Example 1, joining was studied in a composition comprising 90% by weight of tin in the equilibrium diagram shown in FIG. 7. The application of this joining technique to joining between an interposer and a lead frame in a composite lead frame and to joining of board in TCP has already been studied (see Quarterly Journal of the Japan Welding Society, 15 (1), pp. 174 (1977)). In this composition, the eutectic melting point is 217° C. that permits joining to be carried out without thermal damage to a heat-resistant organic material, such as polyimide.

The principle of this joining method will be briefly explained with reference to FIGS. 8A, 8B, and 8C. This method has a great feature that joining can be carried out in the air without any flux. An oxide film of tin is relatively rapidly formed in the air. The formation is particularly rapid at the melting point of tin, i.e., at 232° C. This is the reason why a flux should be used in the conventional soldering. According to the low-temperature gold/tin eutectic joining method (LEM/low temperature Au/Sn eutectic microsoldering) of the invention, the melting point is 217° C., permitting the fusion at the eutectic temperature to begin before the oxidation reaction of tin rapidly proceeds.

Tg of polyimide is generally around 300° C. Since the joining temperature does not reach this temperature, mismatching of joining pitches due to large thermal expansion does not occur. The behavior in the joining in the melting range of the eutectic composition involves a mutual diffusion reaction of gold with tin, fusion, and solidification. In this case, the reaction is very rapid and completed in 5 sec or shorter.

Regarding the melting point after the completion of the joining, as shown in FIGS. 8A to 8C showing the results of analysis of the composition in the solder layer interface by EPMA, the composition is a solidification composition involving the diffusion of copper into the solder layer of gold. In this case, the proportions of gold and tin in the solder layer are such that the eutectic composition is around 90% Sn—10% Au, suggesting that joining begins in the eutectic composition and copper is then diffused therein to cause solidification.

The gold/tin joining of Example 1 was carried out based on the principle of gold/tin eutectic joining by means of a semiconductor chip mounter (an apparatus, called a flip chip mounter, which mounts a non-sealed semiconductor chip on a lead-patterning substrate while confirming the position).

As shown in FIG. 6, a semiconductor chip 1 was disposed on a heating stage 12 of a semiconductor chip mounter so that external electrodes 2 of the semiconductor chip faced upward. Inner leads 9 of a flexible lead patterning substrate 6 were mounted on the external electrodes (bumps) 2 while conducting registration. In this state, the assembly was pressed by means of a pressure tool 13 and heated by means of a heating tool 12 to perform gold/tin joining. The heating and the pressing were simultaneously carried out.

The heating tool shown in FIG. 6 lifts the semiconductor chip 1 and moves it to a position coordinate for registration. In this state, the heating temperature is raised to perform gold/tin joining. The temperature of the heating tool was set at 250° C., and the heating time was 5 sec. The applied pressure of the pressure stage 13 was 5 kgf/mm$^2$.

Under the above conditions, gold/tin joining could be achieved without causing thermal damage to the base film (Upilex) 4, and the joint strength in terms of peel strength was 10 gf per external electrode (gold bump) 2.

The above procedure was repeated, except that the thickness of the thin plating was varied to 0.1, 0.2, 0.3, 0.4, 0.5, 0.6, 0.7, 0.8, 0.9, and 1.0 $\mu$m. As a result, it was found that the optimal tin plating thickness is in the range of from 0.5 to 0.7 $\mu$m. When the tin plating thickness was 0.3 $\mu$m, the peel strength was lowered to 8 gf. When the tin plating thickness was 0.2 $\mu$m, the peel strength was further lowered to 6 gf.

Observation of the section of the solder layer in the gold/tin joining utilizing a gold/tin eutectic alloy has revealed that this unsatisfactory peel strength is attributable to the fact that, when the tin plating is thin, no satisfactory fillet 18 can be formed.

For a tin plating thickness of 0.5 $\mu$m, the composition of the solder layer was analyzed by EPMA. As a result, it was found that the fillet 18 shown in FIG. 9 comprised 10% by weight of gold with the balance consisting of tin, while the reaction fusion layer (high melting layer) 19 comprised 35.5% by weight of gold with the balance consisting of tin.

The gold content 10% by weight substantially corresponds to an gold/tin eutectic composition (melting point 217° C.). Mutual diffusion between molten tin and gold brought about this composition. This composition is fully liquid when a pressure tool of 250° C. is used. Therefore, the application of the pressure caused the composition to flow out into the outside to form the fillet 18.

It appears that gold is further diffused in the remaining tin to increase the concentration of gold, increasing the melting point, which results in solidification. When the tin plating thickness was 1.0 $\mu$m, the amount of the filler 18 layer became large due to the excessively large tin plating thickness, posing a problem of short-circuiting with adjacent external electrode 2.

The joining temperature was varied to 230° C., 240° C., 250° C., and 260° C. with the heating time being constant and 5 sec. As a result, joining could not be achieved at 230° C. On the other hand, good results could be obtained at 240° C., 250° C., and 260° C. Further, thermal damage to Upilex was not observed even at 260° C.

In some cases, 1 to 20% by weight of copper diffused from the inner lead 3 is present in the reaction fusion layer (high melting layer) 19. This phenomenon is observed in the case of high joining temperature or prolongation of the joining time. In this case, however, no difference in reliability was observed.

The above constitution enables a TAB type LOC package shown in FIGS. 3A and 3B and FIGS. 4A and 4B to be easily prepared without use of any device hole for exposure of the inner lead 9. This in turn can provide a semiconductor device utilizing features of the TAB type flexible lead-patterning substrate (TAB tape) 6 of Example 1.

Further, the TAB type flexible lead-patterning substrate is highly flexible and hence can absorb the thermal stress caused due to a difference in coefficient of thermal expansion between the semiconductor chip 1 and the circuit board at the time of mounting on a circuit board, realizing a semiconductor device that is highly reliable with respect to temperature cycling. Further, bringing the diffusion reaction temperature of gold in the gold/tin eutectic alloy to 250° C. or below enables mounting of a non-sealed semiconductor chip onto an organic material.

A TAB type (TOC type) semiconductor device of Example 1 was produced as shown in FIGS. 10A to 10D. At the outset, a base film (an insulating substrate) 4 (a liquid crystal polymer film for this example) was provided (S701). This base film 4 has a dimension of 35 to 300 mm in width, 10 to 100 m in length, and 50 $\mu$m±1.5 $\mu$m in thickness.

A hole (via hole) 21 for providing a solder ball 20 and a package shape hole (a portion of the film is previously cut for final shaping of the package) are formed in the base film 4 (S702). A copper foil 3A is applied onto the fabricated base film 4 (S701).

Next, as shown in FIGS. 10B to 10D and FIGS. 11A to 11D, the semiconductor chip 1 was put on the TAB type tape prepared above, and registration between each of the plurality of external electrodes (bumps/chip salient electrode) 2 comprising 99.9% by weight of gold provided on the main plane of the semiconductor chip and a corresponding one of the joining portions 9A of the inner leads 9 in the leads 3 was carried out, followed by fixation of the semiconductor chip 1 (S801). In this state, heat pressing was carried out under conditions of heating tool temperature of 240 to 260° C., an applied pressure of 1 to 10 kgf/mm$^2$, and joining time 2 to 3 sec to cause a diffusion reaction of gold in the external electrode 2 with tin in the joining portion of the inner lead, thereby forming a gold/tin eutectic alloy to perform gold/tin joining (S802). Thereafter, a liquid mold material (resin) 40 was introduced to seal the periphery of the joined portion (S803).

Next, solder balls are provided respectively on the leads 3 (S804). The base film 4 with semiconductor devices mounted thereon are cut at predetermined positions into each unit (S805).

According to the above production process, a semiconductor device, which has a long life in the gold/tin joined portion and is highly reliable, can be produced by heat treatment at a low temperature. Use of a thermotropic liquid crystal polymer as the insulating film (base film) 4 of the flexible lead-patterning substrate permits a TAB lead-pattern layer (lead) 3 of a copper foil to be applied without any adhesive by virtue of both the insulating properties and adhesion of the thermotropic liquid crystal polymer, resulting in improved flexibility and strength of the flexible lead-patterning substrate.

Next, the construction of the TAB type flexible lead-patterning substrate (hereinafter referred to as "TAB tape") 6 will be explained.

As shown in FIGS. 5A and 5B, the TAB tape 6 is constructed so that the semiconductor chip 1 is connected to the joining portion 9A of the inner lead 9. The joining pad 9A for connection to the external electrode of the semiconductor chip is formed on an extension of the inner lead. Leads are provided on the inner and outer sides of the joining pad, and a land pad 75 for joining of a solder ball is provided for each lead. This structure is called a fan-in fan-out structure because balls are disposed on both outer and inner sides. Realization of this structure in an identical package is very advantageous for an increase in number of pins in the package. The joining pad 9A and the land pad 75 is formed from the same copper foil as used in the pattern layer by chemical etching.

The TAB tape 6 comprises: a base film 4 of a liquid crystal polymer film; and, provided on the base film 4, a TAB lead-pattern layer 3, a land pad 75, and an inner lead 9. The TAB tape 6 is mounted on a circuit board by means of a solder ball 20 joined to the land pad 27. In general, the semiconductor chip 1 has on its main plane external electrodes (gold bumps) 2 constituted by salient bumps. The external electrode facilitates joining between the semiconductor chip 1 and the inner lead 9 and enhances the joining reliability. The inner lead 9 is electrolessly plated with tin to provide a tin plating having a thickness of 0.5 to 0.6 $\mu$m.

The TAB tape 6 was formed as follows. A substrate layer (thickness 50 Å) was formed on the whole surface of a base film 4 having a width of 35 mm and a thickness of 50 $\mu$m by titanium sputtering, and copper was deposited on the substrate layer to a thickness of 3 $\mu$m. The purity of the deposition material for copper used in the deposition was 99.9999%. For example, Japanese Patent Laid-Open No. 10845/1990 discloses that use of 6 N high-purity copper permits a fine lead pattern to be easily formed at a pitch of 50 $\mu$m by the later photochemical etching. The reason for this is considered as follows. By virtue of the high purity of copper, a structural defect of copper is less likely to be created, and, at the time of the formation of a lead-pattern by photochemical etching, the surface and the side face of the etched pattern are smooth, realizing the formation of a pattern having an even width over the whole length, which is less likely to cause a defect, such as pattern breaking. Further, since the pattern is smooth, abnormal precipitation is less likely to occur in surface plating, such as tin plating, so that short circuiting of the pattern is less likely to occur.

A lead-pattern layer was formed on a TAB tape production line using a 35 mm-width copper one side deposited film as a material. As shown in FIGS. 5A and 5B, inner leads 9 for leading a signal from the semiconductor chip 1 were formed on the TAB pattern layer 3 at an equal pitch of 0.166 mm respectively at positions corresponding to external electrodes 2 of the semiconductor chip 1. The inner leads each had a width of 0.066 mm and were provided at intervals of 0.1 mm (pitch 0.166 mm).

Finally, the inner lead 9 portion of the TAB lead-pattern layer 3 and the lead-pattern layer and the land pad in their whole area were electrolessly plated with tin to a thickness of 0.5 to 0.7 $\mu$m, thereby completing a flexible lead-pattering substrate 6.

Further, after the formation of a 50 Å-thick copper deposit, electrolytic copper plating was carried out until the whole thickness reached 3 $\mu$m. In this method, the electrolytic copper is of wet type, and, hence, a thin copper layer the whole of which is formed of 99.9999 wt % copper cannot be formed. Since, however, the substrate layer is formed of high-purity copper, an electrolytic copper plating having no significant defect can be formed. In this case as well, fine leads having a pitch of about 60 $\mu$m can be formed.

The above construction of the TAB type flexible lead-patterning substrate 6 can offer the following function and effect.

(a) Use of an adhesive in the flexible lead-patterning substrate can be eliminated to improve the flexibility, resulting in reduced whole film thickness. Since there is no need to use a hard epoxy resin adhesive, the flexibility can be improved.

(b) Provision of a device hole in the flexible lead-patterning substrate can be eliminated, realizing a structure having high resistance to tensile flexing action. A design for freely providing leads on the whole surface of the film is possible.

(c) Since the film has no device hole, leads can be freely provided on the flat film, offering a high freedom for mounting of multichip leads. Specifically, a lead can be provided just under the mounted semiconductor chip, permitting the lead length to be shortened. In addition, the lead extension area is so large that the area of the lead-patterning substrate can be reduced, contributing to a reduction in size of electronic equipment.

(d) Since the film is located just under the inner lead, the stress is not concentrated directly on the inner lead. Therefore, the reliability with respect to temperature cycling is high. Further, the joint has a structure comprising gold and tin, and, hence, the melting point is high and 217° C. which is much above the melting point of 37 wt % Pb—Sn, 180° C. Therefore, a requirement of 1000 hr (the joined portion is not broken, and electrical connection is maintained) in a conventional high-temperature holding test at 150° C. in the air can be met.

Next, a thermotropic liquid crystal polymer usable as the base film 4 will be explained.

Figure 12:
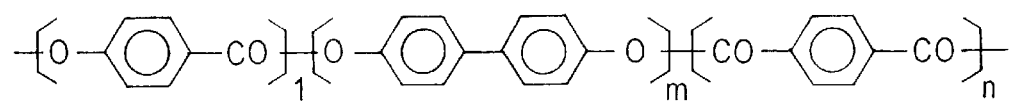
FIG. 12 is a diagram showing the structural formula of a thermotropic liquid crystal polymer.

The thermotropic liquid crystal polymer, as shown in FIG. 12, for example, is Ekonol type of a polyester main chain type liquid crystal polymer. The liquid crystal polymer used herein has a molecular weight of about 10,000 to 100,000.

The polyester main chain type liquid crystal polymer (hereinafter referred to simply as "liquid crystal polymer") exhibits a nematic liquid crystal phase and has low viscosity and low molding temperature, so that the moldability is good and the dimensional stability is good. Further, the heat resistance is excellent.

Figure 13:
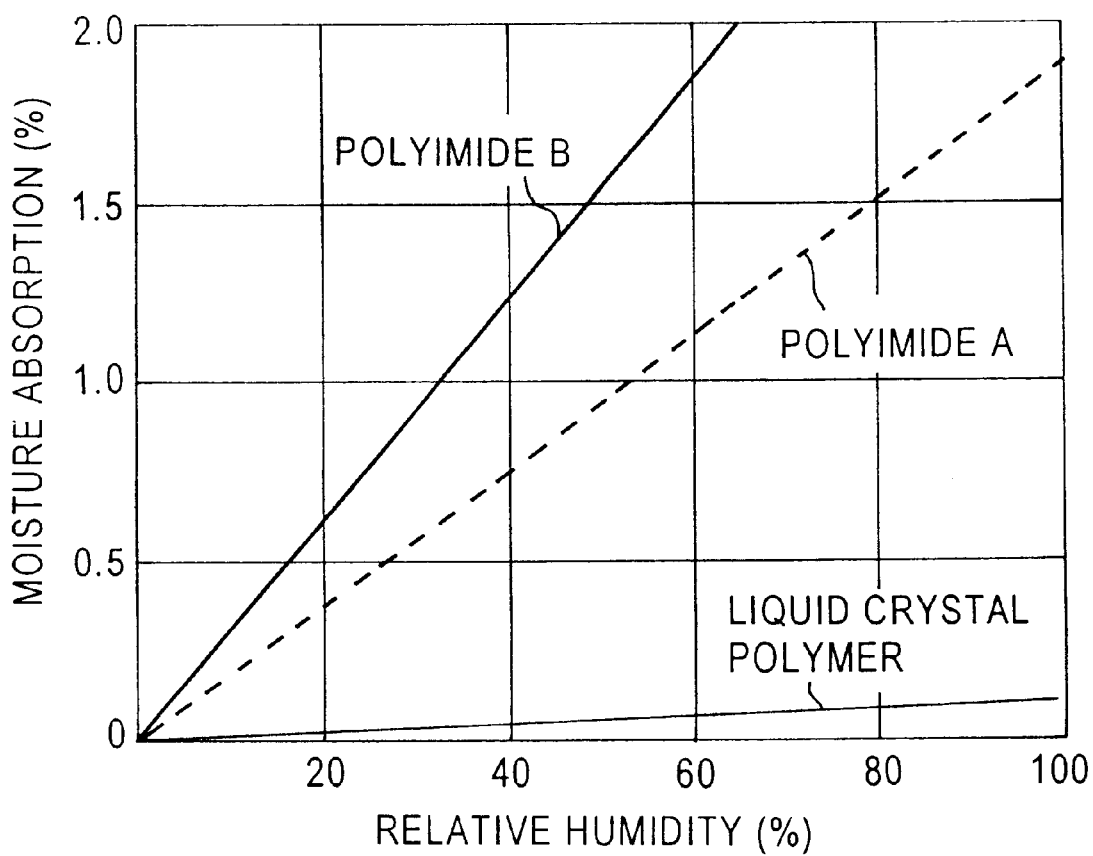
FIG. 13 is a diagram showing the relationship between the relative humidity and the hygroscopicity for a liquid crystal polymer and polyimides.

As shown in FIG. 13, as with the conventional polyimides A and B, the hygroscopicity of the liquid crystal polymer increases with increasing the relative humidity. As compared with the polyimides A and B, however, the hygroscopicity is always low and not more than 0.2%. By virtue of this property, the swelling caused by water absorption can be reduced as compared with the conventional polyimides A and B, leading to an advantage that failure of package, such as cracking of the package, breaking of devices, and breaking of gold leads, can be reduced.

Figure 14:
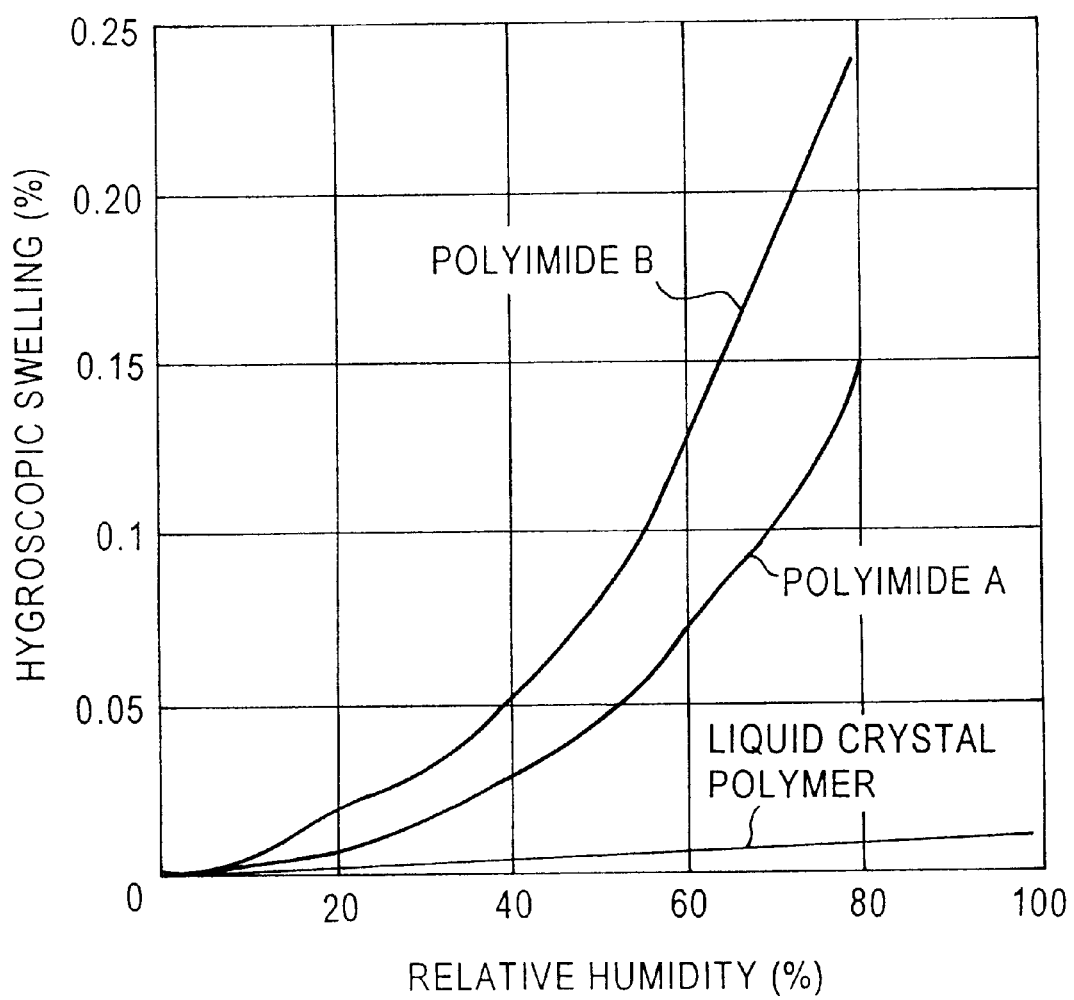
FIG. 14 is a diagram showing the relationship between the relative humidity and the hygroscopic swelling for a liquid crystal polymer and polyimides.

From FIG. 14 showing hygroscopic swelling, it is apparent that, for polyimides A and B, the hygroscopic swelling increases in an exponential function manner with increasing the relative humidity, whereas, for the liquid crystal polymer, the hygroscopic swelling does not substantially increases and is not more than 0.02%. Therefore, there is no fear of the dimension being increased by moisture absorption, which can realize an increase in definition of the pattern of a lead frame in a semiconductor device.

There is a large difference in coefficient of thermal expansion between the conventional polyimides A and B and a silicon chip, making it difficult to directly perform flip chip joining. By contrast, for this liquid crystal polymer, flip chip joining can be directly performed. This eliminate the need to use an elastomer (thermal stress cushioning material) used in the prior art.

Further, from FIG. 14, it is apparent that for epoxy and polyimide B, the specific permittivity increases proportionally with increasing the relative humidity, whereas for the liquid crystal polymer used in Example 1, the specific permittivity is always constant (3.4).

In general, for high-speed transmission at a transmission speed of not less than 800 MHz, the specific permittivity should be constant independently of the relative humidity. Therefore, materials, of which the specific permittivity changes with the relative humidity, such as conventional epoxy polyimide B, could not be applied to high-speed transmission.

Figure 15:
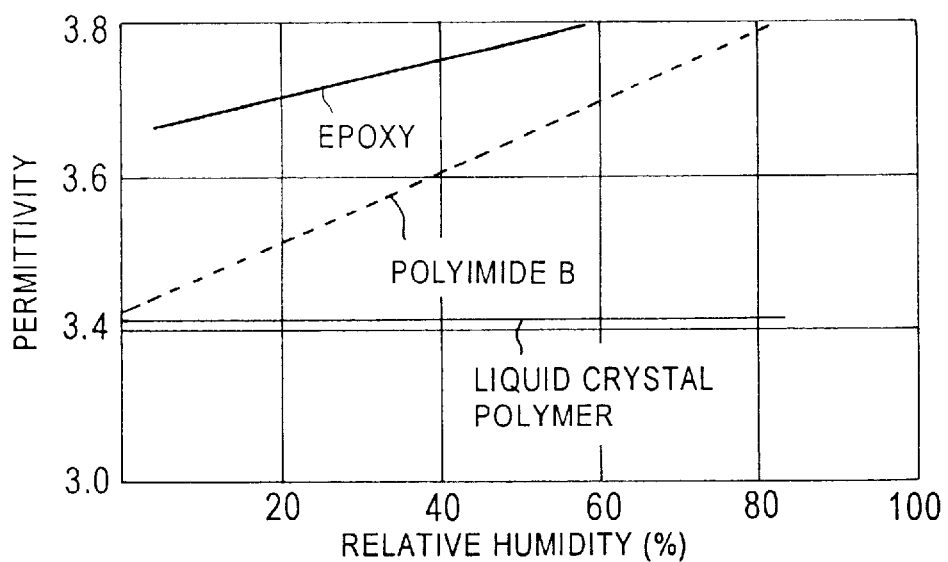
FIG. 15 is a diagram showing the relationship between the relative humidity and the permittivity for a liquid crystal polymer and polyimides.

As shown in FIG. 15, the liquid crystal polymer has a constant specific permittivity of about 3.4 independently of the relative humidity, realizing high-speed transmission of a transmission speed of not less than 800 MHz. Therefore, application to, for example, high-speed memory modules and microprocessor units (MPU) capable of conducting a high-speed transmission of not less than 450 MHz is possible.

Specifically, use of the liquid crystal polymer instead of polyimides, teflon, benzocyclobutene, silicon dioxide and the like; which have hitherto been used as an insulating material for semiconductor devices, for the formation of, for example, TAB tape, layer insulation film in multilayer circuit, or semiconductor chip-loaded substrate, enables the application to electronics devices wherein high-speed transmission is required.

Unlike the polyimides, the liquid crystal polymer has a melting point (for example, melts at 335° C.). Therefore, the liquid crystal polymer may also be applied to a joining material for insulation joining of materials by utilizing this property. The melting point may be varied as desired by varying the molecular weight of the liquid crystal polymer, so that the liquid crystal polymer may be applied as an insulating material and a joining material in a wide variety of applications, such as semiconductor devices and electronics devices. The melting point of the liquid crystal polymer decreases with decreasing the molecular weight. These facts indicate that liquid crystal polymers, which have moisture resistance and constant specific permittivity with respect to the relative humidity, have high melting point, and are not deteriorated at the time of reflow, are best suited as insulating materials in semiconductor devices.

Example 2

In Example 2 of the invention, the procedure of Example 1 was repeated, except that the external electrode (gold bump) 2 was formed using a combination of gold plating with nickel plating. Specifically, 20 μm-thick gold plating is expensive, and a lot of time is taken for plating. Therefore, the 20 μm-thick gold plating is inappropriate from the viewpoint of cost. For this reason, after a salient bump was substantially formed by plating with nickel to a thickness of 19 μm, electroplating of gold was performed to a thickness of 1.0 μm. Thus, a gold bump was formed. In this case, an experiment was carried out wherein the thickness of the tin plating was varied to 0.1, 0.2, 0.3, 0.4, 0.5, 0.6, 0.7, 0.8, 0.9, and 1.0 μm. As a result, it was found that, as with Example 1, the optimal tin plating thickness is in the range of from 0.5 to 0.7 μm. The inner lead, the joining pad 9A and the whole surface on the copper lead-pattern side were plated with gold to a thickness of 1.0 μm. Further, for the external electrodes 2 of the semiconductor chip, a 0.5 μm-thick tin plating was provided on the 19 μm-thick nickel plating, followed by joining in the same manner as in Example 1. As a result, it was confirmed that good joining could also be performed in this reversed combination.

Example 3

In Example 3, the procedure of Example 2 was repeated, except that the external electrode (gold bump) 2 was formed using a combination of copper plating with gold plating. Specifically, 1.0 μm-thick electrolytic nickel plating was provided as a diffusion barrier layer for copper on 18 μm-thick electrolytic copper plating, followed by 1.0 μm-thick electrolytic gold plating as the uppermost layer. As a result of the experiment, it was found that the optimal tin plating thickness was in the range of from 0.5 to 0.7 μm.

Example 4

Figure 16A:
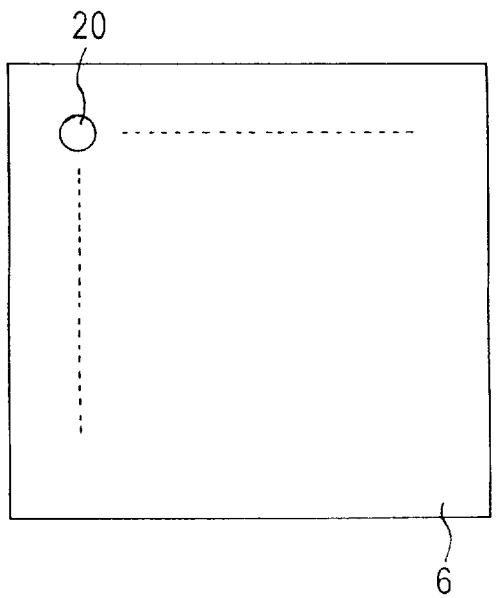
FIGS. 16A and 16B are schematic plan views showing the construction of a CSP type semiconductor device of Example 4 according to the invention.
Figure 16B:
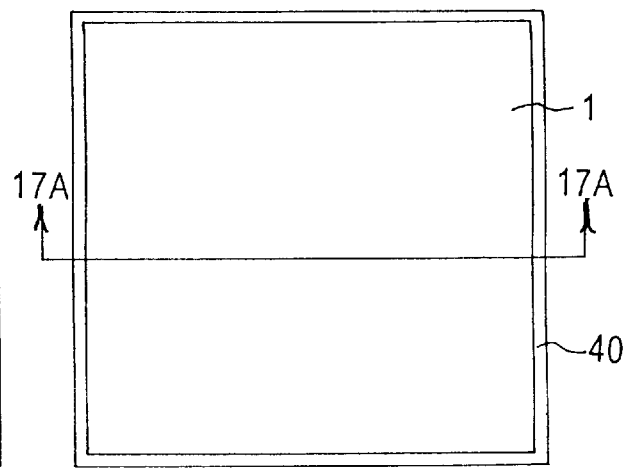
Figure 17A:
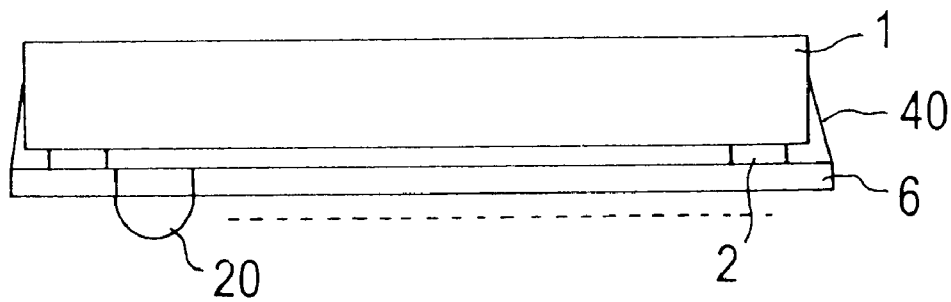
FIG. 17A is a cross-sectional view taken on line 17A—17A of FIG. 16B.
Figure 17B:
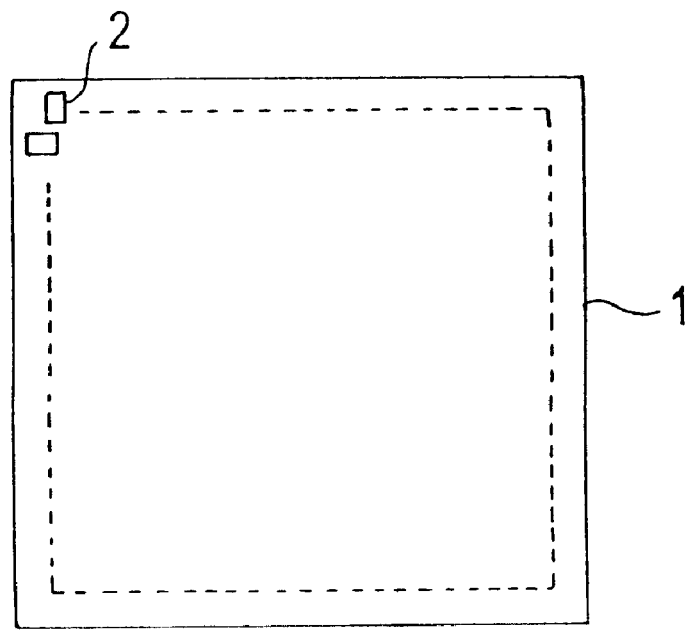
FIG. 17B shows orientation of electrodes.

FIGS. 16A and 16B are schematic plan views showing the construction of a CSP type semiconductor device of Example 4 of the present invention, and FIG. 17A is a cross-sectional view taken on line 17A—17A of FIG. 16B.

As shown in FIGS. 16A and 16B and FIGS. 17A and 17B, the CSP type semiconductor package of Example 4 is an embodiment wherein the whole lead layer is extended to the inner side of the semiconductor chip 1 to prepare a package having the same size as the semiconductor chip 1. In the prior art, for this structure, joining to the external electrode 2 has been carried out by soldering using 37 wt % Pb—Sn or the like. As described above, since the melting point is 180° C., a problem of poor heat resistance occurs. Further, the same flexible lead-patterning substrate (interposer) as used in Example 1 as used.

In the CSP type package of Example 4, a BGA ball 20 serves as a terminal for mounting of a mother board. A solder ball (0.3 mmϕ) having a eutectic composition of 37Pb—Sn was used as the BGA ball 20.

FIGS. 18A and 18B show the construction of a TAB tape used in the CSP type package. In this example, the solder ball was provided at a pitch of 0.3 mm, and the inner lead pitch was 0.1 mm. The tape had a width of 70 mm. The shape of the package has a size of 3.0×3.0 mm, and the package is of a fan-in structure wherein all pins are extended to the inner ball.

FIGS. 19A to 19G are cross-sectional views illustrating each step in the production of the CSP type flexible lead-patterning substrate (interposer) of Example 4.

The production of the CSP type flexible lead-patterning substrate (interposer) of Example 4 will be explained with reference to FIGS. 19A to 19G.

Figure 19A:
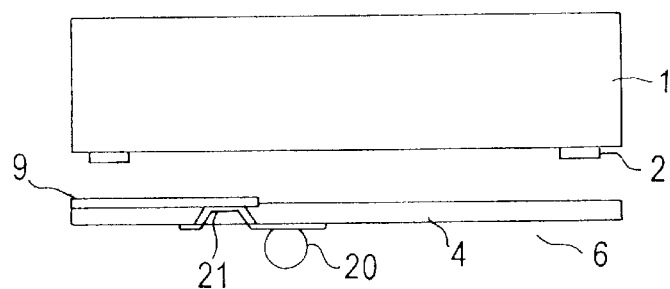
FIGS. 19A to 19G are cross-sectional views showing, in sequence of steps, a method for fabricating a CSP type flexible lead-pattering substrate (interposer) of Example 4 according to the invention.
Figure 19B:
Figure 19C:
Figure 19D:
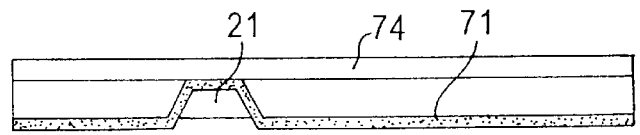
Figure 19E:
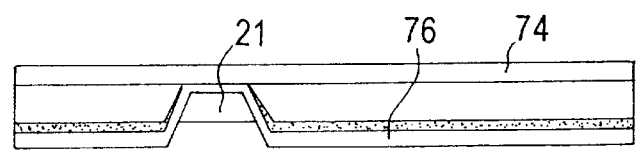
Figure 19F:
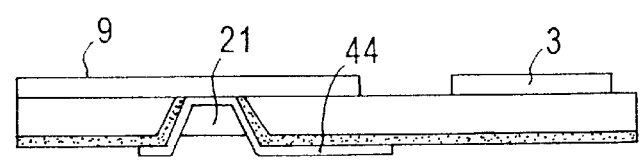
Figure 19G:
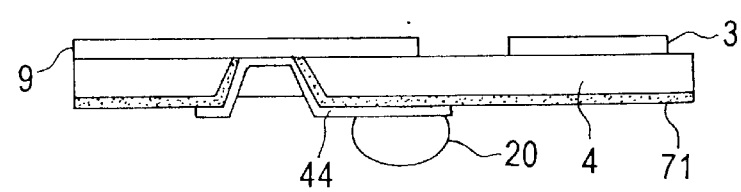

At the outset, as shown in FIG. 19B, a 18 μm-thick copper foil 74 of OFC (oxygen-free copper, oxygen content not more than 0.3 ppm) having a purity of 99.9999 wt % was formed on a 50 μm-thick polyimide film 4. This can be produced by continuously roll-coating polyimide varnish onto the surface of a OFC copper foil and then baking the coating. Next, as shown in FIG. 19C, a via hole of 0.2 mmϕ is formed in the base film (polyimide film) 4 by means of a carbon dioxide gas laser. Thereafter, as shown in FIG. 19D, a photosensitive epoxy resin 71 is coated, and, as shown in FIG. 19E, the via hole is exposed to expose the backside of the copper foil 74, followed by electroless copper plating 76. In this connection, it should noted that the adhesion between the polyimide film 4 and the electroless copper plating 76 is poor. For this reason, an epoxy resin 71 having good adhesion was selected and interposed between the polyimide film and the electroless copper plating without directly providing the copper plating on the polyimide. As shown in FIG. 19F, lead patterns 9 and 44 were then formed respective on the top side and the backside. Next, as shown in FIG. 19G, a BGA ball 20 is formed using a solder ball of 0.3 mmφ having an eutectic composition of 37Pb—Sn on the backside, with the lead pattern 44 formed thereon, in its ball pad portion.

In Example 4, all external electrodes 2 (100 pins) were arranged in a lattice form on the inner side of a semiconductor chip having a size of 3.0 mm square. The BGA ball 20 was disposed at a pitch of 0.3 mm. The number of BGA balls 20 was 100. These BGA balls were disposed in a lattice form (10×10). The copper foil portion of the lead pattern 44 on the via hole 21 is a circular via pad having a diameter of 0.15 mm. For this reason, spacing between via pads was 0.15 mm.

As is apparent from the foregoing description, according to Example 4, the flexible lead-patterning substrate having a CSP structure is so flexible that, advantageously, thermal stress derived from a difference in coefficient of thermal expansion between the semiconductor chip 1 and the mother board can be absorbed at the time of mounting on a circuit board, and the reliability with respect to temperature cycling is high.

The coefficient of thermal expansion of glass epoxy is generally 30 ppm/° C. On the other hand, the silicon chip has a coefficient of thermal expansion of 3.5 ppm/° C. Due to this difference in coefficient of thermal expansion, stress is created between the semiconductor chip 1 and the lead-pattern substrate in a temperature cycling test. In the prior art, a resin was filled into gaps between the external electrodes 2 of the semiconductor chip 1 and the lead-pattern substrate 6 in order to prevent a failure of the joined portion by the stress. In this method, the failure of the external electrodes 1 of the semiconductor chip 1 and the inner leads 9 can be prevented. However, the stress was concentrated on the solder ball, disadvantageously resulting in a failure of the solder ball in about 300 cycles. On the other hand, according to Example 4, the semiconductor device was mounted on a 1.0 mm-thick glass epoxy rigid lead-patterning substrate. Specifically, a pad for receiving the solder ball is provided on the glass epoxy rigid lead-patterning substrate at its position where the solder ball to be provided. The solder ball is mounted on the pad by heat fusion joining of the solder ball to the pad. In a 2000-cycle temperature cycling test between −65° C. and 150° C., damage, such as failure of joined portion, was not observed. The joined portion could withstand a temperature up to 300° C. indicating that the joined portion has heat resistance good enough to withstand a high-temperature standing test at 150° C. in the air for 1500 hr.

Example 5

In Example 5, the procedure of Example 1 as repeated, except that the semiconductor chip was mounted directly on a glass epoxy rigid substrate having a thickness of 0.35 mm and a size of 50 mm square by gold/tin joining according to the present invention. Specifically, the same copper lead pattern as in Example 1 was formed on the uppermost layer of the lead-patterning substrate in the same manner as in Example 1, followed by electrolytic tin coating to a thickness of 0.5 to 0.7 μm. The copper leads were formed by photochemical etching after electroless copper plating of the whole surface with copper. Further, electrolytic tin plating was applied in the same manner as in Example 1. Joining between the external electrodes 2 of the semiconductor chip and the inner leads 9 was carried out in the same manner as in Example 1.

The glass epoxy substrate has a Tg of 170° C. and hence is inferior in heat resistance to the polyamide. However, damage, such as separation of the lead pattern or carbonization of the glass epoxy per se derived from heat transfer by contact with a tool of 250° C., was not caused. However, it should be noted that the coefficient of thermal expansion of the semiconductor chip 2 is 3.5 ppm/° C., while the coefficient of thermal expansion of the glass epoxy substrate is 15 ppm/° C. Therefore, in this structure, stress is directly conveyed to the joining interface of gold and tin. In the present example, in a temperature cycling test between −65° C. and 150° C. for 500 hr, 10% of the joined portions was broken. On the hand, all the 50 PCs tested could withstand 5000 cycles in a temperature cycling test between −25° C. and 125° C.

Example 6

Figure 20:
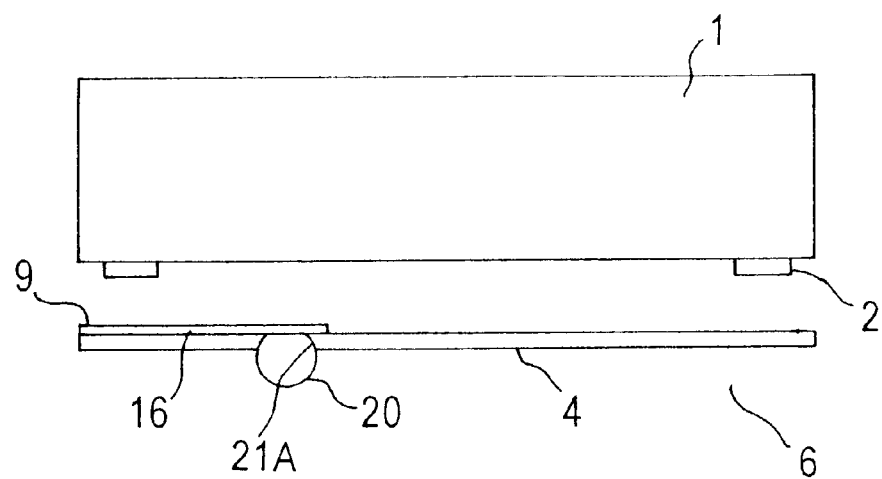
FIG. 20 is a diagram showing a structure, of Example 6 according to the invention, using a one side lead-patterning substrate as a flexible lead-wiring substrate (interposer)

In Example 6, the procedure of Example 4 was repeated, except that a one side lead-patterning substrate was used as the flexible lead-patterning substrate (interposer). This structure is shown in FIG. 20. This structure features the production of CSP at a low cost because the both side lead-pattering substrate is not used. In this structure, a blinder via (which is not a throughhole and has a closed one side) 21A is formed, and a solder ball 20 having a composition of, for example, 37 wt % Pb—Sn is formed directly on the backside of the copper foil provided on one side of the film. Provision of leads on the backside is not required in this structure. What is important to this structure is to press-fit the solder ball 20 into the inside of the blind via 21A. This structure can be provided by using a proper diameter of the blind via 21A, selecting a proper diameter of the solder ball 20, and using a ball mounter having a mechanism suitable for press-fitting the solder ball 20. The diameter of the via hole was 0.15 mm, and the diameter of the solder ball 20 was 0.2 mm. The thickness of Upilex is so small (50 μm) that even a solder ball 20 having a diameter of 0.2 μm can be brought into contact with and soldered to the backside of the copper foil in the blind via 21A formed in the base film.

In Examples 4 and 6, the reinforcing resin was not introduced into between the semiconductor chip 1 and the flexible lead-patterning substrate, because, by virtue of good flexibility or the polyimide, Upilex can absorb stress between the circuit board and the semiconductor chip, preventing the stress from being conveyed to the joined surface of gold and tin. As with Example 4, satisfactory test results could be obtained in the temperature cycling test.

Example 7

In Example 7, the procedure of Example 4 was repeated, except that a 0.2 μm-thick glass epoxy lead-patterning substrate was used as the lead-patterning substrate (interposer). In this structure, the glass epoxy is the same material as that used in the circuit board. That is, the coefficient of thermal expansion is identical. Therefore, stress is not substantially applied to the joining surface, and as with Example 4, satisfactory results could be obtained in the temperature cycling test. Further, gold/tin joining according to the invention could ensure reliability good enough to withstand at a high standing temperature of 150° C. in the air for 1500 hr.

Example 8

In Example 8, the procedure of Example 7 as repeated, except that a 1.0 mm-thick alumina ceramic substrate was used as the lead-patterning substrate. The coefficient of thermal expansion of the alumina substrate is 4.5 ppm/° C., that is, is close to that of the semiconductor chip. Therefore, the thermal stress applied to the joining interface of the alumina substrate and the semiconductor chip 1 was small. However, thermal stress applied to the interface of the glass epoxy circuit board was large. For this reason, the percentage failure of joining in the 500-cycle temperature cycling test was 20% between the solder ball 20 and the circuit board.

Example 9

In Example 9, the procedure of Example 4 was repeated, except that a 1.0 mm-thick glass aramid resin substrate was used as the lead-patterning substrate. As compared with the epoxy resin, the aramid resin has a higher Tg, that is, a Tg of 190° C., and better heat resistance. The coefficient of thermal expansion of the aramid resin is 10 ppm/° C. which is slightly below that of the glass epoxy. By virtue of this coefficient of thermal expansion of the aramid resin intermediate between the coefficient of thermal expansion of the semiconductor chip 1 and the coefficient of thermal expansion of the glass epoxy, as with Example 4, good reliability was obtained.

Example 10

In Example 9, the procedure of Example 1 was repeated, except that an alloy plating comprising 5% by weight of lead with the balance consisting of tin was used instead of the 5 μm-thick tin plating in the lead pattern. The purpose of using the alloy plating was to prevent the occurrence of whiskers attributable to the infernal stress of the electrolytic tin plating. For the tin plating, heating at 200° C. for several seconds eliminates the internal stress and can prevent the occurrence of whiskers. Therefore, joining of the semiconductor chip 1 can prevent the occurrence of whiskers. However, the occurrence of whiskers was often observed during storage before the joining, and, in the case of standing at room temperature, whiskers occurred about three weeks after the initiation of the standing. When the prevention of occurrence of whiskers before joining is important, the addition of lead in an amount of 1 to 5% by weight is effective.

In this case, when the liquid crystal polymer is used as the base film 4, joining can be achieved, without using any adhesive, by simply heat-melting the surface of the liquid crystal polymer. On the other hand, when other base film 4 is used, the copper foil is applied with the aid of an adhesive. A photoresist is coated onto the copper foil applied to the base film 4, followed by exposure to form a lead pattern (leads) (S704 in FIG. 10A). A solder resist was printed thereon using a screen mask, and a tin plating was then provided by electroless plating to prepare a TOC type tape (S704 in FIG. 10A).

Example 11

Figure 21:
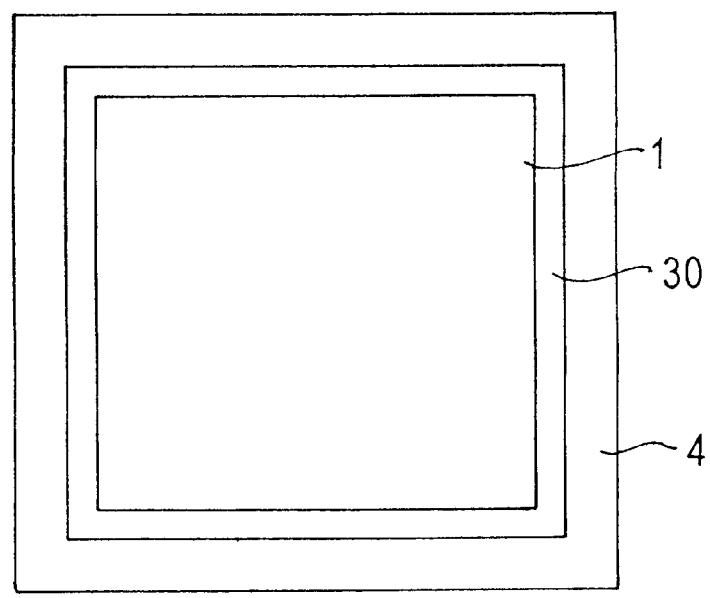
FIG. 21 is a schematic plan view showing the construction of a TOC type semiconductor device of Example 11 according to the invention.
Figure 22:
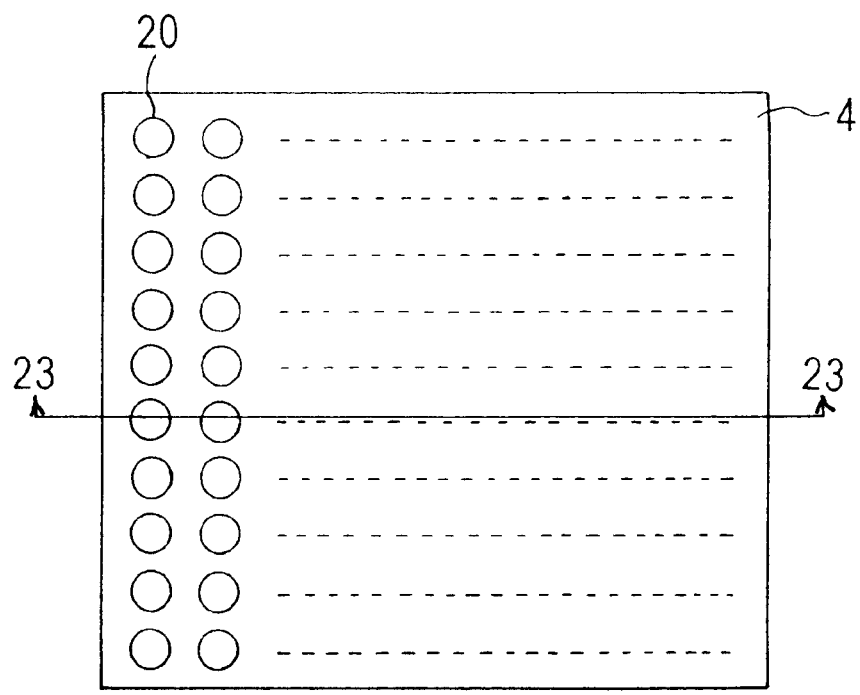
FIGS. 22 is a plan view of the semiconductor device shown in FIG. 21, as viewed from the direction of balls.
Figure 23:
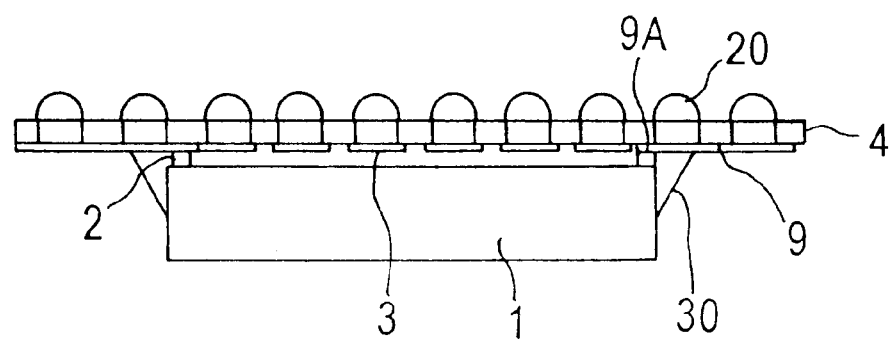
FIG. 23 is a cross-sectional view taken on line A–A' of FIG. 22.

FIG. 21 is a schematic plan view showing the construction of a TOC (tape on chip) type semiconductor device of Example 11 of the present invention, FIG. 22 is a plan view as viewed from the direction of the ball, and FIG. 23 is a cross-sectional view taken on line A–A' of FIG. 22.

As shown in FIGS. 21 and 22, the TOC type semiconductor device of Example 11 comprises: a semiconductor chip 1 having on its main plane a plurality of external electrodes 2; and a lead-patterning substrate comprising leads 3 provided on an insulating, flexible film (an insulating substrate) 4. Each of plurality of external electrodes (salient chip electrodes) 2 provided on the main plane of the semiconductor chip 1 is joined to a corresponding one of joining portions 9A of inner leads 9 in the leads 3 by low-temperature eutectic joining. Each portion joined by eutectic joining is sealed by a resin layer 30 formed by resin coating (or by a resin tape). The external electrode 2 is coated with gold or tin, and the joining portion 9A of the inner lead 9 is coated with tin or gold. The fillet portion 18 in the solder layer formed by joining between the gold and tin coatings mainly has a composition having a first eutectic point (melting point 217° C.), that is, comprises 5 to 20% by weight of gold with the balance consisting of tin, while the reaction fusion layer (high melting layer) 19 comprises 10 to 40% by weight of gold with the balance consisting of tin.

For example, 99.9% Au may be used as the external electrode 2 with, for example, a liquid crystal polymer being used as the insulating, flexible film 4. For example, a copper foil comprising a tin layer provided on a 99.9% Cu layer may be used as leads provided on the insulating, flexible film 4. Materials for the resin layer 30 formed by resin coating or by a resin tape include, for example, epoxy. The solder ball 20 may be made of, for example, a lead/tin eutectic solder.

Figure 24:
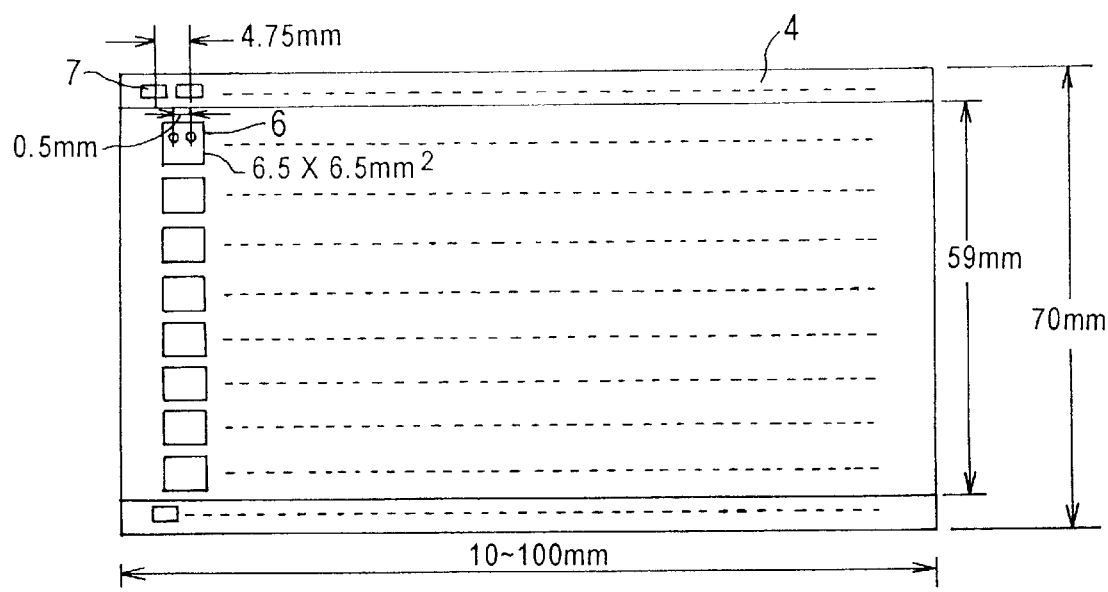
FIG. 24 is a schematic diagram showing the construction of a TOC type tape of Example 11 according to the invention.

FIG. 24 is a schematic diagram showing the construction of the TOC tape of Example 11. For example, the width of the TOC tape is 70 mm, the width of the region, where the solder ball 20 is provided, is 59 mm, the solder ball 20 pitch is 0.5 mm, and the pitch of a sprocket hole for the TOC tape is 4.75 mm.

Figure 25:
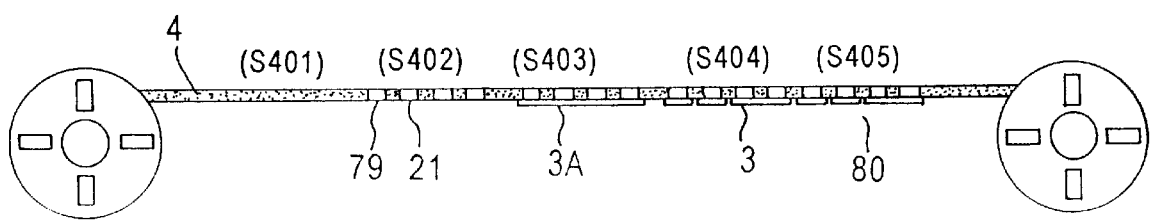
FIG. 25 is a diagram showing, in sequence of steps, a method for fabricating a TOC type semiconductor device.
Figure 26:
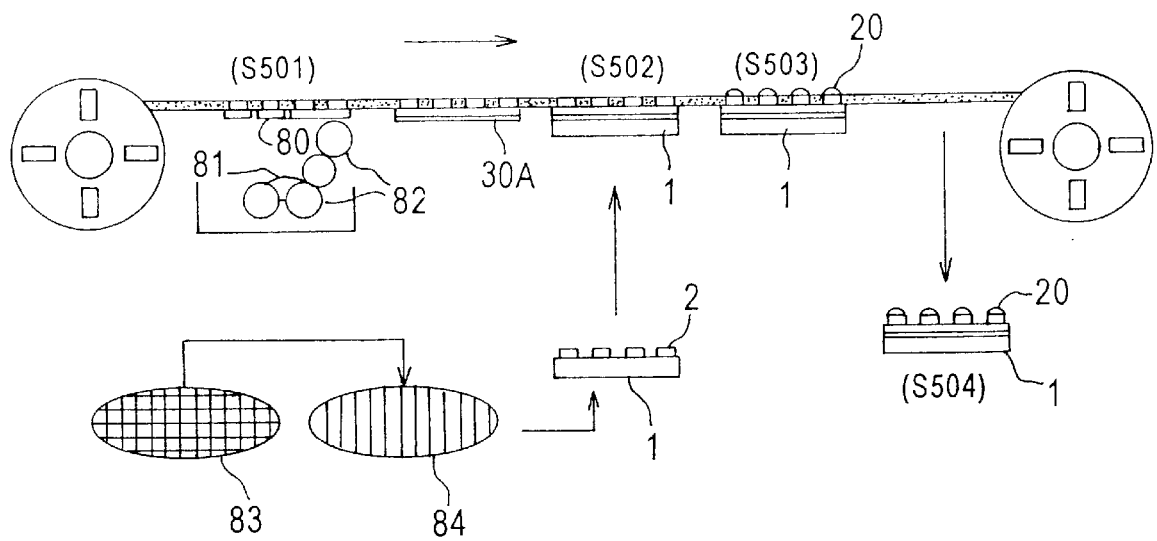
FIG. 26 is a diagram showing, in sequence of steps, a method for fabricating another TOC type semiconductor device.

FIGS. 25 and 26 are diagrams showing, in sequence of steps, a method for fabricating a TOC type semiconductor device.

As shown in FIG. 25, in the production of the TOC type semiconductor device of Example 11, an insulating, flexible film (an insulating substrate) 4 of a liquid crystal polymer is provided (S401). The insulating, flexible film 4 has a dimension of 70 mm in width, 10 to 100 m in length, and 50 μm±1.5 μm in thickness.

A hole 21 for setting of a solder ball 20 and a package shape hole 79 are formed in the insulating, flexible film 4 (S402). A copper foil 3A is applied onto the fabricated insulating, flexible film 4 (S403). In this case, when the liquid crystal polymer is used as the insulating, flexible film 4, joining can be achieved, without using any adhesive, by simply heat-melting the surface of the liquid crystal polymer. On the other hand, when other insulating flexible film 4 is used, the copper foil is applied with the aid of an adhesive.

A photoresist is coated onto the copper foil applied to the insulating, flexible film 4, followed by exposure to form a lead pattern (leads) 3 (S404). A solder resist was printed thereon using a screen mask, and a tin plating was then provided by electroless plating to prepare a TOC type tape 80 (S404).

As shown in FIG. 26, the TOC type tape 80 thus prepared is then coated with a resin coating 81 by means of a roller 82 (or covered with a resin tape) to form a resin layer 30A (S501). After registration between the plurality of external electrodes (salient chip electrodes) 2 of 99.9% Au provided on the main plane of the semiconductor chip 1 and the joining portions 9A of the inner leads 9, a semiconductor chip 1 was fixed onto this resin layer 30A. In this state, heat pressing was carried out under conditions of heating tool temperature 220 to 250° C., applied pressure 1 to 10 kgf/mm², and heat pressing time 2 to 3 sec to cause a diffusion reaction of gold in the external electrodes 2 with tin in the joining portions 9A of the inner leads 9 in the leads 3, thereby forming a gold/tin eutectic alloy to perform gold/tin joining and, at the same time, melting the resin layer to seal the joined portions including the eutectic solder with the resin layer 30 (S502).

The external electrode 2 comprises salient gold, or a salient metal plated with gold and is previously provided. After the heat pressing, a joined portion of gold and tin was obtained wherein the high-melting layer formed the interface of the external electrode and the joining portion of the inner lead comprises 10 to 40% by weight of gold with the balance consisting of tine, while the fillet portion mainly has a eutectic composition comprising 5 to 20% by weight of gold with the balance consisting of tin.

Next, each of solder balls 20 are provided on a corresponding one of the leads 3 (S503), and the insulating, flexible film 4 with a semiconductor devices mounted thereon are cut at predetermined positions into each unit (S504).

As is apparent from the foregoing description, according to Example 11, in the joined portion of gold and tin, the high-melting layer in the interface of the external electrode and the joining portion of the inner lead comprises 10 to 40% by weight of gold with the balance consisting of tin, and the solder layer in the filler portion comprises 5 to 20% by weight of gold with the balance consisting of tin. The joined portion of gold and tin is sealed with the resin layer 30. This enables a semiconductor device having a long life in the joined portion of gold and tin and high reliability to be produced by heat treatment at a low temperature.

Further, the formation of eutectic solder and the sealing of the joined portion including the eutectic solder with the resin can be carried out in an identical step by forming a resin layer of a resin coating or a resin tape on inner leads 9 in leads 3 on a lead-patterning substrate comprising leads 3 provided on an insulting substrate, conducting registration between the joining portion of each external electrode and the joining portion of each of the inner leads in the leads, fixing a semiconductor chip onto the resin layer, conducting heat pressing in this state to cause a diffusion reaction of the joining portions of the external electrodes and the joining portions of the inner leads, thereby forming eutectic solder, and, at the same time, melting the resin layer to seal the resultant joined portion including the eutectic solder with the resin.

Further, this enables the joined portion including the eutectic solder to be sealed with a resin having no significant cell, leading to an advantage that a semiconductor device possessing a long life in joined portion including eutectic solder and high reliability can be obtained. In the joining between the semiconductor chip and the inner lead, the joining portion of the external electrode is coated with one of gold and tin, and the joining portion of the inner lead is coated with the other, followed by intimate contact of the gold coating with the tin coating and heat pressing under conditions of temperature 220 to 250° C. (first eutectic point: 217° C.), pressure 1 to 10 kgf/mm², and heat pressing time 2 to 3 sec to form eutectic solder of gold and tin as a result of a diffusion reaction. Specifically, the resultant joined portion including the eutectic solder of gold and tin comprises: a high-melting layer formed in the interface of the joining portion of the external electrode and the joining portion of the inner lead, the high melting layer comprising 10 to 40% by weight of gold with the balance consisting of tin; and a fillet portion comprising 5 to 20% by weight of gold with the balance consisting of tin. This enables a semiconductor device possessing a long life in the jointed portion including solder of gold and tin and high reliability to be obtained by heat treatment at a low temperature.

Example 12

Figure 27:
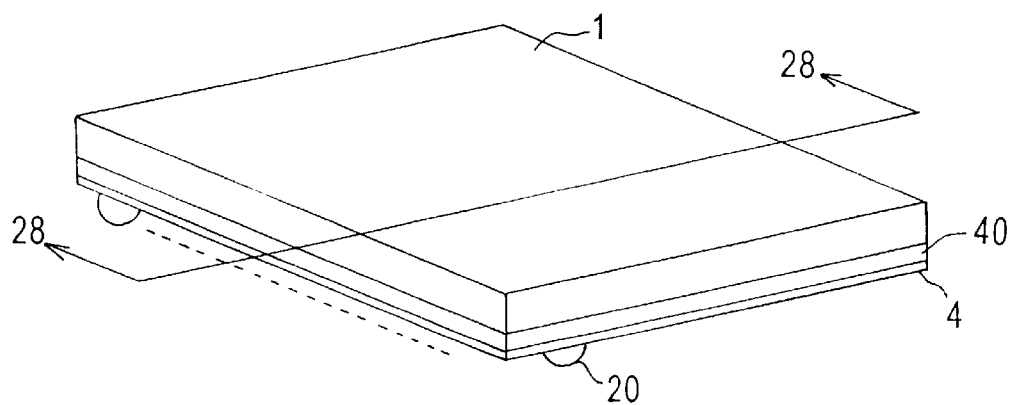
FIG. 27 is a schematic perspective view showing the construction of a $\mu$BGA type semiconductor device of Example 12 according to the invention.
Figure 28:
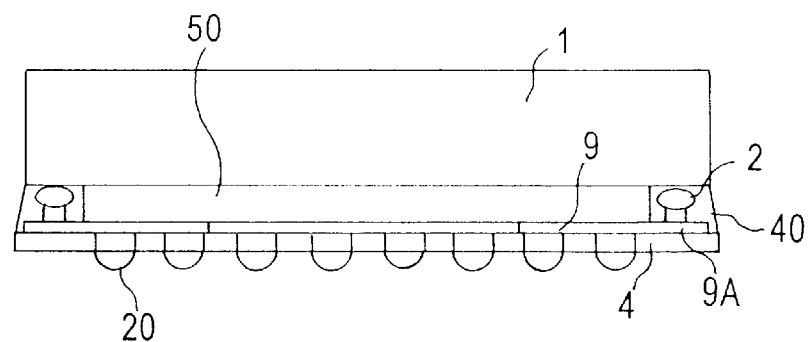
FIG. 28 is a cross-sectional view taken on line 28—28 of FIG. 27.

FIG. 27 is a schematic perspective view showing the construction of a μBGA type semiconductor device of Example 12 of the invention, and FIGS. 28 is a cross-sectional view taken on line 28—28 of FIG. 27.

As shown in FIGS. 27 and 28, the μBGA type semiconductor device of Example 12 comprises: a semiconductor chip 1 having on its main plane a plurality of external electrodes 2; a lead-patterning substrate comprising a predetermined pattern of leads 3 provided on an insulating, flexible film (a polyimide film) 4 (a μBGA tape); solder balls 20 electrically connected respectively onto the leads 3; and a cushioning material (hereinafter referred to as an "elastomer") 50 for relaxing thermal stress applied to the semiconductor chip 1 and the leads 3. Each of the leads 3 has an inner lead 9 having a joining portion 9A which is joined by low-temperature eutectic soldering to a corresponding one of the plurality of external electrodes 2 to form a joined portion. The joined portion is sealed with a mold resin 40.

The external electrode 2 is coated with one of gold and tin, and the joining portion of the inner lead 9 is coated with the other metal. In the solder layer formed by joining between the gold and tin coatings at a low temperature, the fillet portion 18 mainly has a composition having a first eutectic point (melting point 217° C.), that is, comprises 5 to 20% by weight of gold with the balance consisting of tin, while the reaction fusion layer (high-melting layer) 19 comprises 10 to 40% by weight of gold with the balance consisting of tin.

For example, 99.9% Au may be used as the external electrode 2 with, for example, a polyimide film or a liquid crystal polymer being used as the insulating, flexible film 4.

For example, a copper foil comprising a tin layer provided on a 99.9% Cu layer may be used as leads 3 provided on the insulating, flexible film 4. The mold resin 40 may be, for example, an epoxy resin, and the solder ball 20 may be made of, for example, a lead/tin eutectic solder.

The elastomer 50 may be a low-elasticity material having a thickness of about 25 to 150 μm, particularly a low-elasticity elastomer having a coefficient of viscoelasticity of 10 to 5000 MP at −65° C. to 150° C. Specific examples thereof include silicone resins and rubber-loaded, low-elasticity epoxy resins. The elastomer functions to absorb thermal stress created between the lead patterning substrate of glass epoxy resin (coefficient of thermal expansion 10 to 20 ppm/° C.) and the silicon chip (coefficient of thermal expansion 3 ppm/° C.). By virtue of this property, a high reliability exceeding 1000 cycles can be obtained with respect to thermal stress in temperature cycling between −65° C. and 150° C.

Figure 29A:
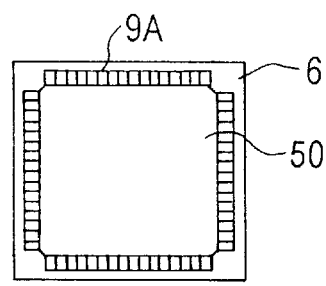
FIGS. 29A and 29B are schematic diagrams showing the construction of leads of the lead-patterning substrate of the $\mu$BGA type semiconductor device shown in FIG. 27.
Figure 29B:
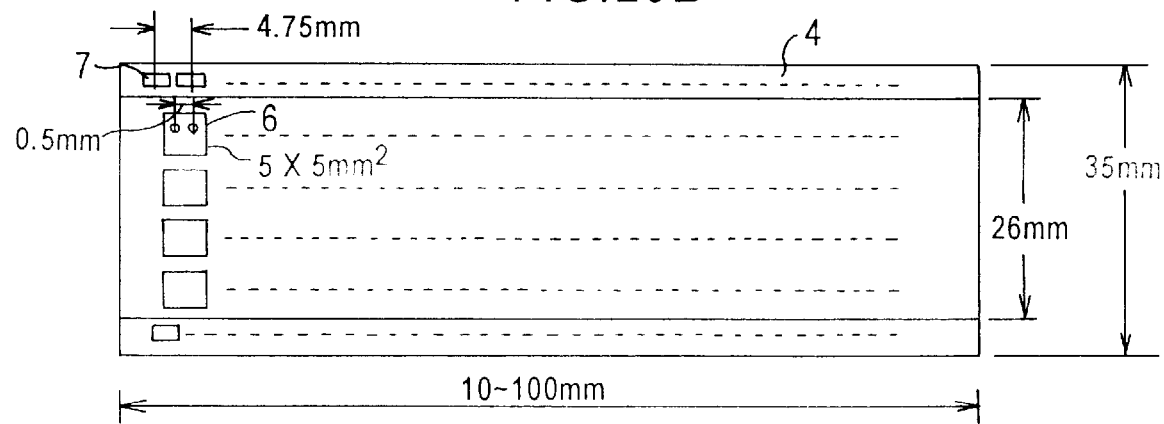

FIGS. 29A and 29B are schematic diagrams showing the construction of leads in the above lead-pattering substrate.

FIGS. 30A to 30D are diagrams showing, in sequence of steps, a method for fabricating a μBGA type semiconductor device.

As shown in FIGS. 30A to 30D, in the production of the μBGA type semiconductor device of Example 12, an insulating, flexible film (an insulating substrate) 4 of a liquid crystal polymer is provided. The insulating, flexible film 4 has a dimension of 35 mm in width, 10 to 100 m in length, and 50 μm±1.5 μm in thickness.

Figure 30A:
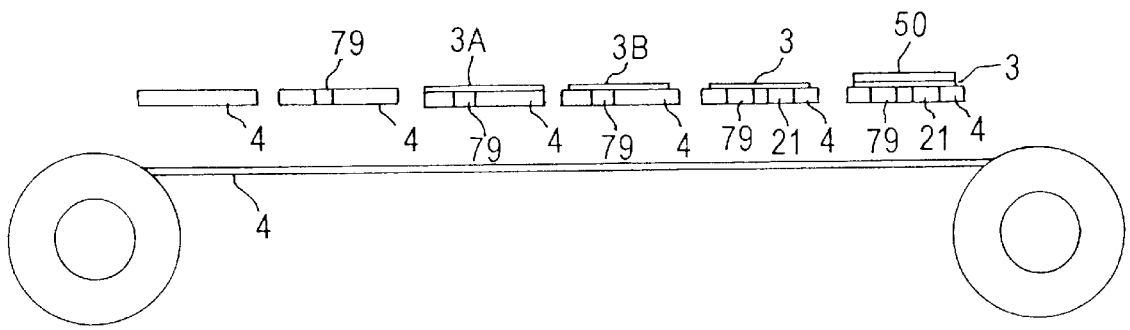
FIGS. 30A to 30D are diagrams showing, in sequence of steps, a method for fabricating a $\mu$BGA type semiconductor device.

In the first step, as shown in FIG. 30A, a package shape hole 79 is formed in the flexible film 4. A copper foil 3A is applied onto the fabricated flexible film 4. In this case, when the liquid crystal polymer is used as the insulating, flexible film 4, joining can be achieved, without using any adhesive, by simply melting the surface of the liquid crystal polymer. On the other hand, when other flexible film is used, the copper foil is applied with the aid of an adhesive.

A photoresist is coated onto the copper foil applied to the fabricated flexible 4, followed by exposure to form a lead pattern (leads). A hole 21 for providing a solder bump is formed using a mask in the flexible film 4 so as to reach the lead, thereby preparing a μBGA type TOC tape. An elastomer 50 is applied to the lead-patterning face of the μBGA type TOC tape. The elastomer per se has adhesion.

Figure 30B:
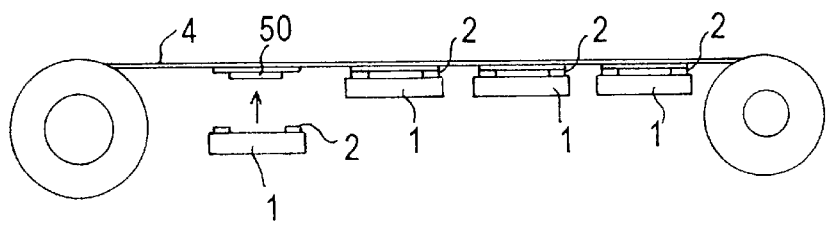

In the second step, as shown in FIG. 30B, after registration between each of the external electrode 2 and a corresponding one of the joining portions 9A of the inner leads 9 in the leads 3, the lower surface of the elastomer 50 is applied to the semiconductor chip 1 on its external electrode 2 side to fix the semiconductor chip 1. In this state, heat pressing is carried out under conditions of heating tool temperature 240 to 260° C., applied pressure 1 to 10 kgf/mm$^2$, and heat pressing time 2 to 3 sec to cause a diffusion reaction of gold in the external electrodes 2 with tin in the joining portions 9A of the inner leads 9 in the leads 3, thereby forming a eutectic solder of gold and tin.

Figure 30C:
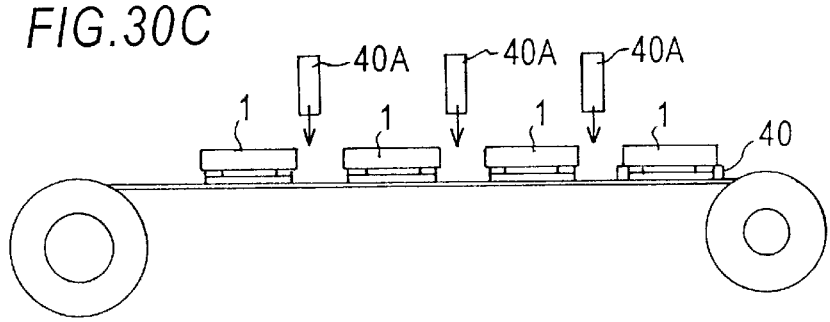

In the third step, as shown in FIG. 30C, sealing with a molding resin (epoxy) 40 is carried out by potting or the like.

Figure 30D:
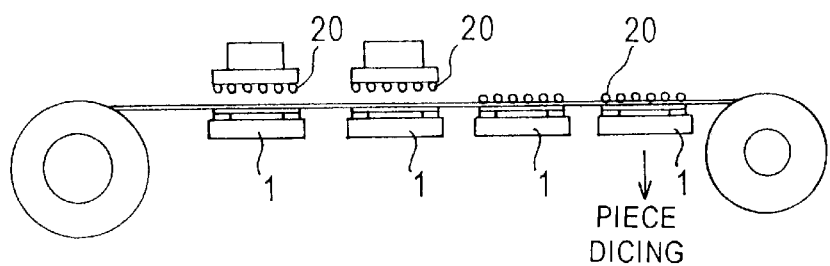

In the fourth step, as shown in FIG. 30D, a solder ball 20 is press-fitted into the hole 21 for providing a solder bump, followed by heat treatment at a temperature of about 210° C. to electrically connect the solder ball 20 to the lead 3. The insulating, flexible film 4 with semiconductor devices mounted thereon is cut at predetermined positions into each unit.

As is apparent from the foregoing description, according to Example 12, the joining portion of the external electrode 12 is coated with one of gold and tin, and the joining portion 9A of the inner lead 9 is coated with the other metal, followed by intimate contact of the gold coating with the tin coating and heat pressing under conditions of temperature 240 to 260° C. (first eutectic point: 217° C.), pressure 1 to 10 kgf/mm$^2$, and heat pressing time 2 to 3 sec to form eutectic solder of gold and tin as a result of a diffusion reaction. The resultant joined portion comprises: a fillet portion 18 which mainly has a eutectic composition of the first eutectic point (melting point 217° C.) comprising 5 to 20% by weight of gold with the balance consisting of tin; and a reaction fusion layer (a high-melting layer) 19 comprising 10 to 40% by weight of gold with the balance consisting of tin. This enables a μBGA type semiconductor device possessing a long life in the jointed portion including solder of gold and tin and high reliability to be obtained by heat treatment at a low temperature.

The invention has been explained in detail with reference to preferred embodiments (examples), but it will be understood that variations and modifications can be effected within the sprit and scope of the invention.

Representative effects attained by the invention will be summarized as follows.

(1) The flexible lead-patterning substrate has improved flexibility because it has no adhesive layer.

(2) The TAB type flexible lead-patterning substrate has improved strength because it has no device hole.

(3) Since the TAB type flexible lead-patterning substrate has no device hole, a lead can be easily extended just under the semiconductor chip and on the periphery of the semiconductor chip (this structure being generally called a fan-in fan-out structure). In addition, the lead length can be shortened. Further, the degree of freedom for mounting of a plurality of semiconductor chips can be increased. Further, the lead extending area is so large that the area of the lead-patterning substrate can be reduced, realizing a reduction in size of electronics devices.

(4) Provision of the insulating film just under the inner leads prevents stress from being concentrated directly on the inner leads, resulting in improved reliability with respect to temperature cycling.

(5) In the solder layer of gold and tin joining the external electrodes to the inner leads, the fillet portion mainly has a composition having a first eutectic point (melting point 217° C.), that is, comprises 5 to 20% by weight of gold with the balance consisting of tin, while the reaction fusion layer (high melting layer) 19 comprises 20 to 40% by weight of gold with the balance consisting of tin. The solder layer is highly resistant to the action of thermal stress in temperature cycling environment. The joining can be achieved by heat treatment at a low temperature. Therefore, the life of the joined portion including the gold/tin solder can be prolonged, making it possible to produce highly reliable semiconductor device, such as TAB type semiconductor devices, PCSP type semiconductor devices, and μBGA type semiconductor devices.

(6) Provision of a lead just under the semiconductor chip can realize a single chip package structure. For example, a CSP type semiconductor device can be easily prepared.

(7) Bringing the gold/tin eutectic soldering temperature to 250° C. or below enables a non-sealed semiconductor chip to be mounted on the lead-patterning substrate comprising a base film of an organic material.

The invention has been described in detail with particular reference to preferred embodiments, but it will be understood that variations and modifications can be effected within the scope of the present invention as set forth in the appended claims.

What is claimed is:

1. A semiconductor device, comprising:
   a semiconductor chip having on its main plane a plurality of external electrodes each having a joining portion;
   a flexible lead-patterning substrate comprising an insulating, flexible base film having a first plane and a second plane, the first plane having thereon leads each having a-joining portion for joining to the semiconductor chip and provided with an inner lead portion electrically connected to the joining portion of said leads, the second plane having therein via holes and joining portions for solder balls, each of the joining portions, for solder balls, being electrically connected through a corresponding one of the via holes to a corresponding one of the inner lead portions and having thereon a solder ball, the external electrodes each in its joining portion being joined through solder to a corresponding one of the joining portions, for the semiconductor chip, provided on the first plane of the base film to form a joined portion; and
   a molding resin for sealing said joined portion including the solder, wherein:
   the joining portion of the external electrode comprises a metal selected from the group consisting of gold and tin;

the joining portion of the semiconductor chip, provided on the first plane of the base film comprises a metal selected from the group consisting of gold and tin;
the metal constituting the joining portion of the external electrode is different from the metal constituting the joining portion provided on the first plane of the base film; and
the solder comprises gold/tin solder.

2. A semiconductor device, comprising:
a semiconductor chip having on its main plane a plurality of external electrodes each having a joining portion;
a lead-pattering substrate comprising leads provided on an insulating, flexible base film, each of the leads having an inner lead being provided with an inner lead having a joining portion which is joined through solder to a corresponding one of the joining portions of said external electrodes of said semiconductor chip to provide a joined portion;
solder balls electrically connected respectively onto the leads;
a thermal stress cushioning material elastomer for relaxing thermal stress with respect to the semiconductor chip and the leads; and
a molding resin for sealing said joined portion including the solder, wherein:
the joining portion of the external electrode comprises a metal selected from the group consisting of gold and tin;
the joining portion of the inner lead comprises a metal selected from the group consisting of gold and tin;
the metal constituting the joining portion of the external electrode is different from the metal constituting the joining portion of the inner; and
the solder comprises gold/tin solder.

3. A semiconductor device, comprising:
a semiconductor chip having on its main plane a plurality of external electrodes each having a joining portion;
an insulating substrate having a predetermined pattern of leads thereon, each of said leads being provided with an inner lead having a joining portion which is joined through solder to a corresponding one of the joining portions of said external electrodes of said semiconductor chip to provide a joined portion; and
a resin layer, formed from a resin coating or a resin tape, for sealing said joined portion including the solder, wherein:
the joining portion of the external electrode comprises a metal selected from the group consisting of gold and tin;
the joining portion of the inner lead comprises a metal selected from the group consisting of gold and tin;
the metal constituting the joining portion of the external electrode is different from the metal constituting the joining portion of the inner lead; and
the solder comprise gold/tin solder.

4. The semiconductor device according to claim 3, wherein the joined portion comprises a solder layer of a god/tin solder, the solder layer comprising: a fillet which mainly has a composition having a first eutectic point (melting point 217° C.) comprising 5 to 20% by weight of gold with the balance consisting of tin; and a reaction fusion layer (a high melting layer) comprising 10 to 40% by weight of gold with the balance consisting of tin.

5. A semiconductor device, comprising:
a semiconductor chip having on its main plane a plurality of external electrodes each having a joining portion;
an insulating substrate having a predetermined pattern of leads thereon, each of said leads being provided with an inner lead having a joining portion which is joined through solder to a corresponding one of the joining portions of said external electrodes of said semiconductor chip to provide a joined portion; and
a molding resin for sealing said joined portion including the solder, wherein:
the joining portion of the external electrode comprises a metal selected from the group consisting of gold and tin;
the joining portion of the inner lead comprises a metal selected from the group consisting of gold and tin;
the metal constituting the joining portion of the external electrode is different from the metal constituting the joining portion of the inner lead;
the solder comprises gold/tin solder; and
the joined portion comprises a solder layer of a gold/tin solder, the solder layer comprising:
a fillet which mainly has a composition having a first eutectic point (melting point 217° C.) comprising 5 to 20% by weight of gold with the balance consisting of tin, and
a reaction fusion layer (a high melting layer) comprising 10 to 40% by weight of gold with the balance consisting of tin.

6. The semiconductor device according to claim 5, wherein the solder layer of gold/tin solder comprise not more than 1.0% by weight of lead as a minor additive element in addition to gold and tin.

7. The semiconductor device according to claim 5, wherein the solder layer of gold/tin solder comprises, in addition to gold and tin, a diffusion-dissolved base metal element from the joined metal base.

8. A semiconductor device, comprising:
a semiconductor chip having on its main plane a plurality of external electrodes each having a joining portion;
an insulating substrate having a predetermined pattern of leads thereon, each of said leads being provided with an inner lead having a joining portion which is joined through solder to a corresponding one of the joining portions of said external electrodes of said semiconductor chip to provide a joined portion; and
a molding resin for sealing said joined portion including the solder, wherein:
the joining portion of the external electrode comprises a metal selected from the group consisting of gold and tin;
the joining portion of the inner lead comprises a metal selected from the group consisting of gold and tin;
the metal constituting the joining portion of the external electrode is different from the metal constituting the joining portion of the inner lead;
the joining portion of the external electrode comprises any one of a thick electrolytic gold plating in a bump form, an electroless gold plating, a deposited gold layer, a sputtered gold layer, and a thin gold coating provided on a salient (a bump) of a thick nickel, chromium, copper or other metallic plating; and
the solder comprises gold/tin solder.

9. A semiconductor device, comprising:
a semiconductor chip having on its main plane a plurality of external electrodes each having a joining portion;
an insulating substrate having a predetermined pattern of leads thereon, each of said leads being provided with an inner lead having a joining portion which is joined through solder to a corresponding one of the joining portions of said external electrodes of said semiconductor chip to provide a joined portion; and a molding resin for sealing said joined portion including the solder, wherein:

the joining portion of the external electrode comprises a metal selected from the group consisting of gold and tin;

the joining portion of the inner lead comprises a metal selected from the group consisting of gold and tin;

the metal constituting the joining portion of the external electrode is different from the metal constituting the joining portion of the inner lead;

the joining portion of the inner lead comprises any one of an electrolytic gold plating, an electroless gold plating, a deposited gold layer, and a sputtered gold layer; and the solder comprises gold/tin solder.

10. A semiconductor device, comprising:

a semiconductor chip having on its main plane a plurality of external electrodes each having a joining portion;

an insulating substrate having a predetermined pattern of leads thereon, each of said leads being provided with an inner lead having a joining portion which is joined through solder to a corresponding one of the joining portions of said external electrodes of said semiconductor chip to provide a joined portion; and a molding resin for sealing said joined portion including the solder, wherein:

the joining portion of the external electrode comprises a metal selected from the group consisting of gold and tin;

the joining portion of the inner lead comprises a metal selected from the group consisting of gold and tin;

the metal constituting the joining portion of the external electrode is different from the metal constituting the joining portion of the inner lead;

the joining portion of the external electrode comprises any one of a thick electrolytic tin plating in a bump form, an electroless tin plating, a deposited tin layer, a sputtered tin layer, and a thin tin plating provided on a thick bump (a bump) of a nickel, chromium, copper or other metallic plating; and the solder comprises gold/tin solder.

11. A semiconductor device, comprising:

a semiconductor chip having on its main plane a plurality of external electrodes each having a joining portion;

an insulating substrate having a predetermined pattern of leads thereon, each of said leads being provided with an inner lead having a joining portion which is joined through solder to a corresponding one of the joining portions of said external electrodes of said semiconductor chip to provide a joined portion; and a molding resin for sealing said joined portion including the solder, wherein:

the joining portion of the external electrode comprises a metal selected from the group consisting of gold and tin;

the joining portion of the inner lead comprises a metal selected from the group consisting of gold and tin;

the metal constituting the joining portion of the external electrode is different from the metal constituting the joining portion of the inner lead;

the joining portion of the inner lead comprises any one of an electrolytic tin plating, an electroless tin plating, a deposited tin layer, and a sputtered tin layer; and the solder comprises gold/tin solder.

12. A semiconductor device, comprising:

a semiconductor chip having on its main plane a plurality of external electrodes each having a joining portion;

an insulating substrate having a predetermined pattern of leads thereon, each of said leads being provided with an inner lead having a joining portion which is joined through solder to a corresponding one of the joining portions of said external electrodes of said semiconductor chip to provide a joined portion; and a molding resin for sealing said joined portion including the solder, wherein:

the joining portion of the external electrode comprises a metal selected from the group consisting of gold and tin;

the joining portion of the inner lead comprises a metal selected from the group consisting of gold and tin;

the metal constituting the joining portion of the external electrode is different from the metal constituting the joining portion of the inner lead;

the joining portion of the external electrode comprises a thick salient gold or tin coating, or a gold or tin coating provided on a salient of a metal other than gold or a heat-resistant organic material; and the solder comprises gold/tin solder.

13. A semiconductor device, comprising:

a semiconductor chip having on its main plane a plurality of external electrodes each having a joining portion;

an insulating substrate having a predetermined pattern of leads thereon, each of said leads being provided with an inner lead having a joining portion which is joined through solder to a corresponding one of the joining portions of said external electrodes of said semiconductor chip to provide a joined portion; and a molding resin for sealing said joined portion including the solder, wherein:

the joining portion of the external electrode comprises a metal selected from the group consisting of gold and tin;

the joining portion of the inner lead comprises a metal selected from the group consisting of gold and tin;

the metal constituting the joining portion of the external electrode is different from the metal constituting the joining portion of the inner lead;

the solder comprises gold/tin solder; and the lead-patterning substrate comprises any one of a copper lead-pattering glass epoxy substrate, a copper lead-patterning glass polyimide substrate, a copper lead-pattering BT resin, a copper lead-patterning fluororesin substrate, a copper lead-patterning aramid substrate, a copper lead-patterning ceramic substrate, a copper lead-patterning (or indium, titanium oxide lead-patterning) glass substrate, a copper lead-patterning polyimide film, a copper lead-patterning liquid crystal polymer, and a copper lead-patterning glass epoxy film.

14. An electronic device comprising:

a Rambus type semiconductor device module, the Rambus type semiconductor device module comprising a plurality of semiconductor devices, mounted on a Rambus type lead-patterning substrate;

each of said plurality of semiconductor devices comprising:

a semiconductor chip having on its main plane a plurality of external electrodes each having a joining portion;

an insulating substrate having a predetermined pattern of leads thereon, each of said leads being provided with an inner lead having a joining portion which is joined through solder to a corresponding one of the joining portions of said external electrodes of said semiconductor chip to provide a joined portion; and a molding resin for sealing said joined portion including the solder, wherein:

the joining portion of the external electrode comprises a metal selected from the group consisting of gold and tin;

the joining portion of the inner lead comprises a metal selected from the group consisting of gold and tin;

the metal constituting the joining portion of the external electrode is different from the metal constituting the joining portion of the inner lead; and the solder comprises gold/tin solder.

* * * * *